United States Patent
Colfer et al.

(10) Patent No.: US 7,737,006 B2
(45) Date of Patent: Jun. 15, 2010

(54) METHODS AND APPARATUS TO FORM ELECTRONIC COMPONENTS WITH AT LEAST ONE N- OR P-DOPED PORTION

(75) Inventors: Paul Colfer, Co. Offaly (IE); Lorraine Byrne, Dublin (IE); Eugene Cahill, Meath (IE); Phil Keenan, Lucan (IE); Niall Stobie, Dublin (IE)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/533,291

(22) PCT Filed: Oct. 30, 2003

(86) PCT No.: PCT/EP03/50768

§ 371 (c)(1),
(2), (4) Date: Feb. 7, 2006

(87) PCT Pub. No.: WO2004/040627

PCT Pub. Date: May 13, 2004

(65) Prior Publication Data

US 2006/0237719 A1    Oct. 26, 2006

(30) Foreign Application Priority Data

Oct. 30, 2002    (GB)    ................................. 0225202.1

(51) Int. Cl.
*H01L 21/30*    (2006.01)
*H01L 21/36*    (2006.01)
(52) U.S. Cl. ........................ 438/478; 438/502
(58) Field of Classification Search .................... 257/49
See application file for complete search history.

(56) References Cited

U.S. PATENT DOCUMENTS

| | | | |
|---|---|---|---|
| 4,003,770 A * | 1/1977 | Janowiecki et al. | ........... 438/97 |
| 4,940,623 A | 7/1990 | Bosna et al. | |
| 5,114,744 A | 5/1992 | Cloutier et al. | |
| 5,391,841 A * | 2/1995 | Quick | .......................... 174/258 |
| 5,800,611 A | 9/1998 | Christensen | |
| 5,866,471 A * | 2/1999 | Beppu et al. | ................. 438/502 |

(Continued)

FOREIGN PATENT DOCUMENTS

DE    197 46 515 A    8/1998

(Continued)

OTHER PUBLICATIONS

United States Patent and Trademark Office, "Office Action," issued in connection with U.S. Appl. No. 10/854,450, mailed Jul. 25, 2008 (8 pages).

(Continued)

*Primary Examiner*—Kenneth A Parker
*Assistant Examiner*—Anthony Ho

(57) ABSTRACT

A method of manufacturing an electronic component comprising at least one n- or p-doped portion, comprising the steps of: co-depositing inorganic semi-conducting nanoparticles and dopant on a substrate, the nanoparticles being a group four element such as silicon or germanium; fusing the nanoparticles by heating to form a continuous layer; and subsequently; and, recrystallising the layer.

20 Claims, 25 Drawing Sheets

U.S. PATENT DOCUMENTS

Figure 1A:
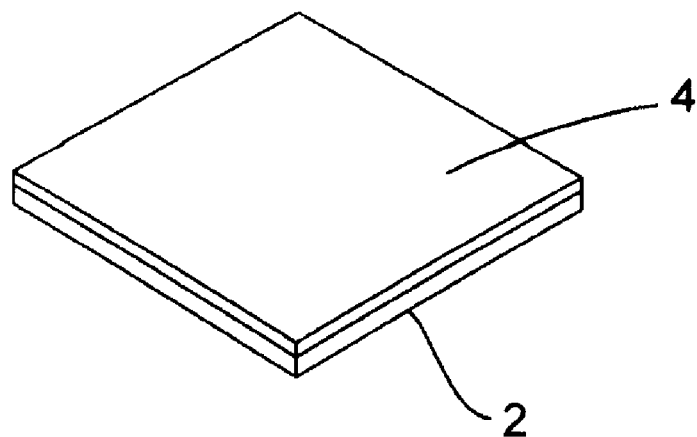
Figure 1B:
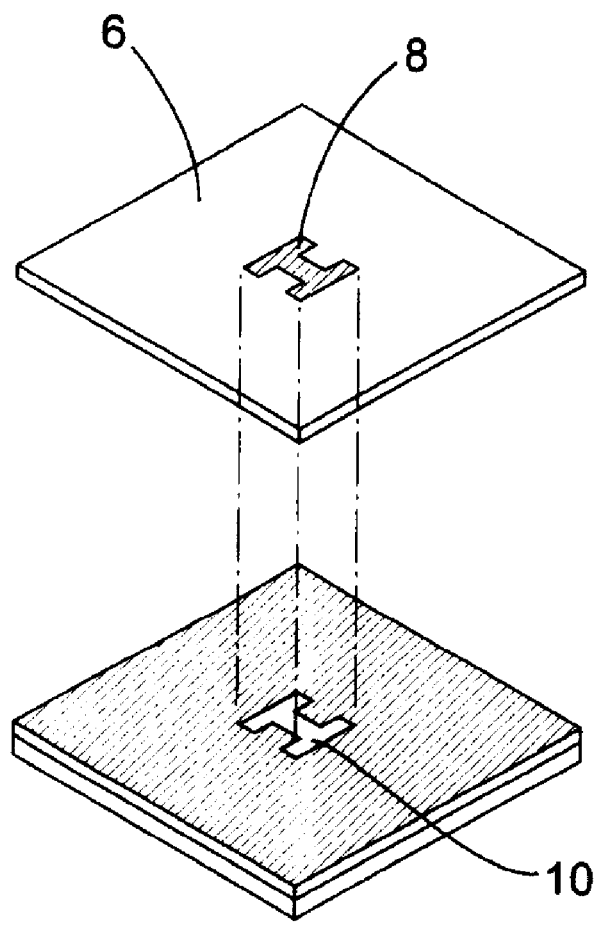

| | | | |
|---|---|---|---|
| 5,876,615 A | 3/1999 | Predetechensky | |
| 5,891,528 A | 4/1999 | Turek et al. | |
| 5,989,700 A | 11/1999 | Krivopal | |
| 6,021,050 A | 2/2000 | Ehman et al. | |
| 6,076,723 A | 6/2000 | I-Tsung Pan | |
| 6,086,945 A * | 7/2000 | Kamata et al. | 427/74 |
| 6,224,180 B1 | 5/2001 | Pham-Van-Diep et al. | |
| 6,251,488 B1 | 6/2001 | Miller et al. | |
| 6,491,969 B2 | 12/2002 | Eldridge | |
| 6,503,831 B2 | 1/2003 | Speakman | |
| 6,518,087 B1 * | 2/2003 | Furusawa et al. | 438/96 |
| 6,527,843 B1 | 3/2003 | Zaima et al. | |
| 6,541,354 B1 * | 4/2003 | Shimoda et al. | 438/478 |
| 6,641,860 B1 | 11/2003 | Kaiserman et al. | |
| 6,645,569 B2 | 11/2003 | Cramer et al. | |
| 6,689,950 B2 * | 2/2004 | Cordaro | 136/250 |
| 6,767,775 B1 * | 7/2004 | Yudasaka et al. | 438/156 |
| 7,063,869 B2 | 6/2006 | Yamazaki et al. | |
| 7,176,040 B2 | 2/2007 | Sirringhaus et al. | |
| 7,369,122 B2 | 5/2008 | Cross et al. | |
| 7,378,291 B2 | 5/2008 | Yamazaki et al. | |
| 2001/0021760 A1 * | 9/2001 | Matsuki et al. | 528/10 |
| 2002/0149656 A1 | 10/2002 | Nohr et al. | |
| 2003/0047816 A1 * | 3/2003 | Dutta | 257/788 |
| 2004/0137710 A1 * | 7/2004 | Grigoropoulos et al. | 438/622 |
| 2005/0266154 A1 | 12/2005 | Devos et al. | |

FOREIGN PATENT DOCUMENTS

| | | |
|---|---|---|
| DE | 198 45 496 A | 4/2000 |
| EP | 1 085 578 A | 3/2001 |
| EP | 1 106 712 A | 6/2001 |
| EP | 1 223 615 A | 6/2002 |
| WO | WO 200059015 A1 * | 10/2000 |
| WO | WO 200059044 A1 * | 10/2000 |

OTHER PUBLICATIONS

United States Patent and Trademark Office, "Office Action," issued in connection with U.S. Appl. No. 10/854,450, mailed Jan. 7, 2009 (7 pages).

United States Patent and Trademark Office, "Office Action," issued in connection with U.S. Appl. No. 10/854,450, mailed Jul. 9, 2009 (10 pages).

United States Patent and Trademark Office, "Office Action," issued in connection with U.S. Appl. No. 10/854,450, mailed Jan. 25, 2010 (8 pages).

Fuller et al., "Ink-Jet Printed Nanoparticle Microelectromechanical Systems," Journal of Microelectromechanical Systems, vol. 11, No. 1, Feb. 2002 (7 pages).

* cited by examiner

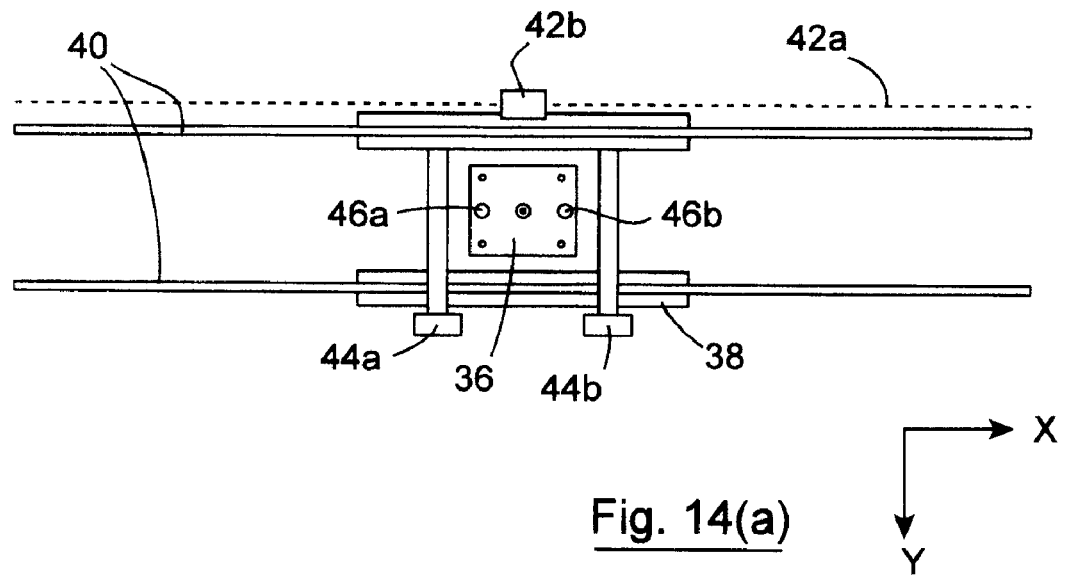
Fig. 14(a)
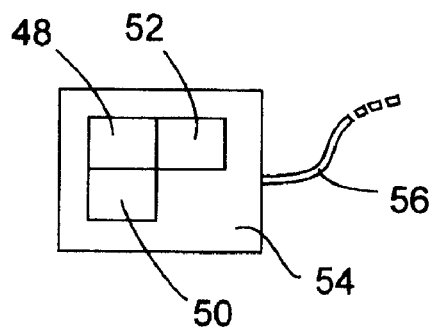
Fig. 15(a)
Fig. 15(b)

METHODS AND APPARATUS TO FORM ELECTRONIC COMPONENTS WITH AT LEAST ONE N- OR P-DOPED PORTION

FIELD OF THE INVENTION

The present invention relates generally to low cost electronic components and circuitry and to methods and apparatus for manufacturing such electronic components and circuitry.

BACKGROUND TO THE INVENTION

Semiconductor fabrication traditionally employs a series of technologically demanding steps. For instance in the case of the manufacture of high performance transistors these may include: vacuum deposition methods to deposit conductors, followed by the application of photo-resist, exposing, developing, etching and then dopant implantation. Such methods must be performed in a clean room environment to prevent contamination of the substrate that would result in gaps in the metal layers or photo-resists. Additionally, they require the use of dangerous chemicals that necessitate the adoption of stringent safety procedures. These processes result in the requirement of a large capital investment. Consequently, the final product is relatively expensive.

Over recent years the demand for low-cost electronics has grown significantly. This is especially true in technological areas which have up until now not been associated with the use of electronics, such as clothing, packaging, or retail items.

It would therefore be desirable to provide electronic components and a method and apparatus for manufacturing such electronic components, which address the problems found in the prior art.

SUMMARY OF THE INVENTION

According to one aspect of the present invention there is provided a method of manufacturing an electronic component comprising at least one n- or p-doped portion, comprising the steps of: co-depositing inorganic semi-conducting nanoparticles and dopant on a substrate, the nanoparticles comprising a group four element such as silicon or germanium; fusing the nanoparticles by heating to form a continuous layer; and subsequently; recrystallising the layer.

Methods of component manufacturing according to this aspect of the invention give rise to various advantages over known manufacture methods. In certain embodiments of the invention, such nanoparticles may be deposited in precise locations and quantities in a flexible manner, without the need for expensive techniques such conventional chemical vapour deposition. In one embodiment of the invention, an inkjet printing process is used to deposit the nanoparticles suspended in a carrier fluid.

Furthermore, the use of group IV elements, such as silicon or germanium, when recrystallised provides high electrical performance, which may be significantly higher that that available from organic semiconductors, inorganic oxide semiconductors and compound inorganic semiconducting materials.

The use of such materials also gives rise to the advantage of allowing the ready formation of both n-type and p-type semiconductor material, using conventional doping techniques. For the manufacture of logical operators, n-p-n and p-n-p junctions are required. Thus, using embodiment of the present invention, such logical operators may be readily constructed. This may be contrasted with the use of processes which employ the use of organic material; such as semiconducting polymers, which currently can only produce p-type junctions. In this manner, in embodiments of the invention, logical operators to be produced substantially entirely through inkjet deposition.

In one embodiment of the invention, at least one dimension of the area on the substrate to be occupied by the nanoparticles is selected using a prior step of printing. In one embodiment, this is achieved using a soft contact lithographic printing process, where a hydrophobic material is accurately stamped onto the substrate. The nanoparticles, suspended in this embodiment in an aqueous solution, are then limited, through hydrophobic/hydrophilic interaction to an accurately predetermined area. In this manner, the final recrystallised layer may have accurately determined dimensions or geometry.

Preferably, the step of fusing and/or recrystallising is carried out by laser processing.

Preferably, the step of fusing and/or recrystallising is carried out in a reducing atmosphere, such as 2% hydrogen.

According to another aspect of the present invention there is provided a method of manufacturing an electronic component comprising at least one n- or p-doped portion, comprising the steps of: co-depositing discrete nanoparticles of semi-conducting material with a dopant on a substrate; fusing the nanoparticles with one or more first laser pulses to form an continuous structure; and subsequently, recrystallising the continuous structure with one or more second laser pulses.

Methods of the present aspect of the invention may provide, in a relatively simple process, the accurate placement of nanoparticles, which are to form the doped portion of the electronic component. The deposition may be achieved using inkjet techniques for example.

During the fusing step, the particles can be rapidly brought into intimate contact with one another and then held together by surface tension of the liquid so formed. In this manner the possibility of causing ablation or physically disrupting the particles, layer or film during the recrystallisation process may be mitigated. Furthermore, the prior fusing step allows improved heat transfer between the adjacent portions of the particles/film. This allows selected areas of the film to reorder relatively readily, producing recrystallisation of the now continuous film or layer as a comparatively more ordered crystalline structure progresses through the material during the recrystallisation phase. It has been found that such a process yields a relatively high quality recrystallised film or structure.

In certain embodiments, the nanoparticles are inorganic materials, such as silicon or germanium. This may provide for the creation of high performance electrical structures.

Preferably, the nanoparticles have an average diameter in the range of 3-120 nanometers.

Under certain circumstances it has been found to be beneficial for the duration of melting of the particles during the fusing step to be longer than the duration of melting of the continuous structure during the recrystallisation step.

Preferably, the steps of fusing and/or recrystallising are carried out in a reducing atmosphere, to counter any oxidisation to the nanoparticles that may have previously occurred. Such an atmosphere may comprise approximately 2% hydrogen, for example.

According to another aspect of the present invention there is provided an ink suitable for inkjet printing comprising a suspension of inorganic nanoparticles suspended in carrier fluid, the nanoparticles comprising a group four element such as silicon or germanium.

Figure 16A:
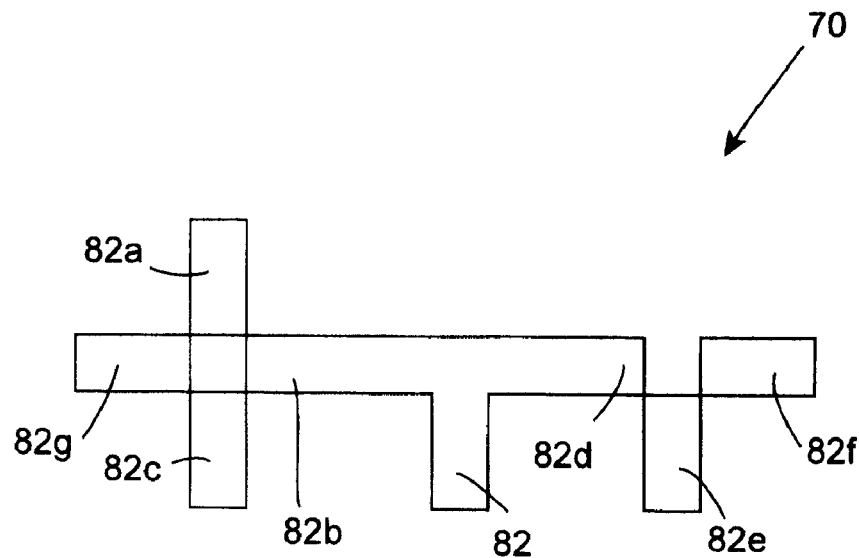
Figure 16B:
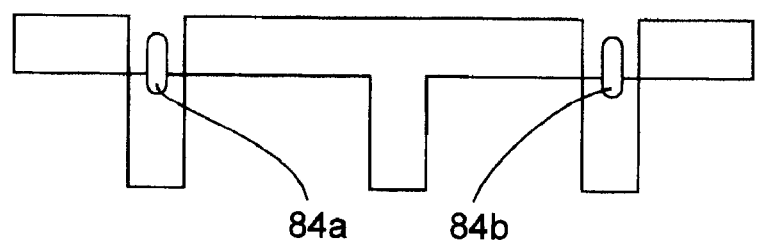
Figure 16C:
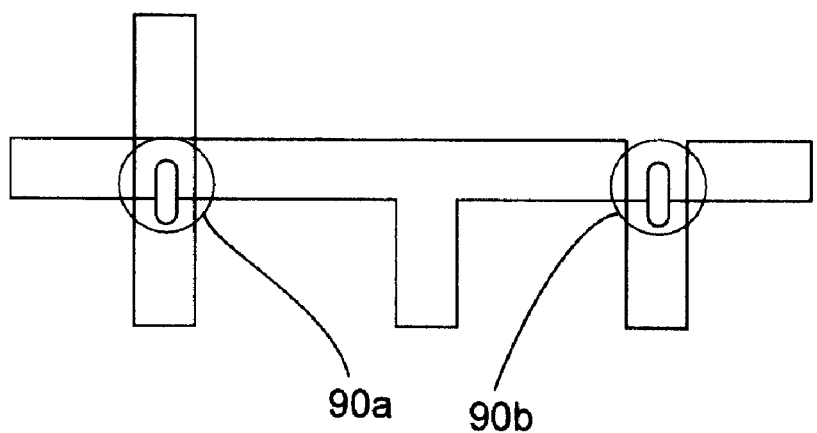
Figure 16D:
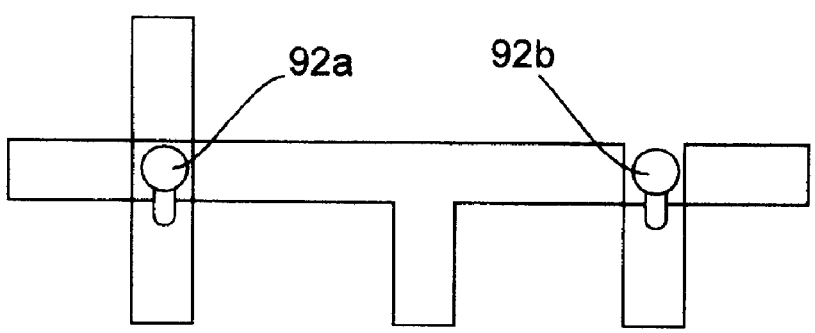
Figure 16E:
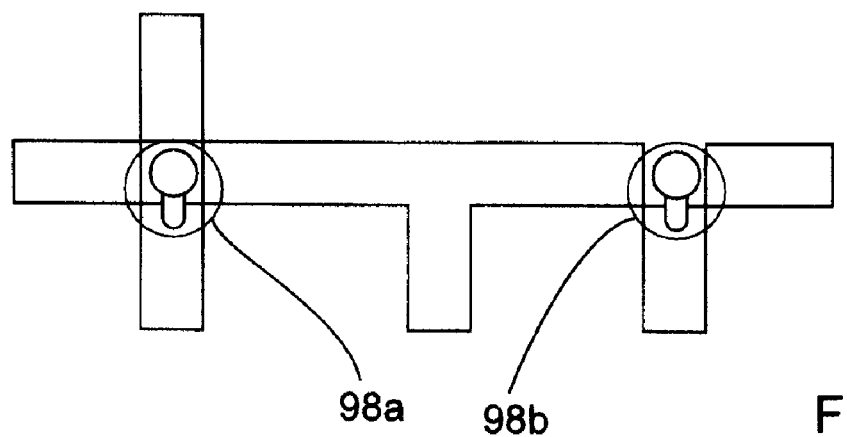
Figure 16F:
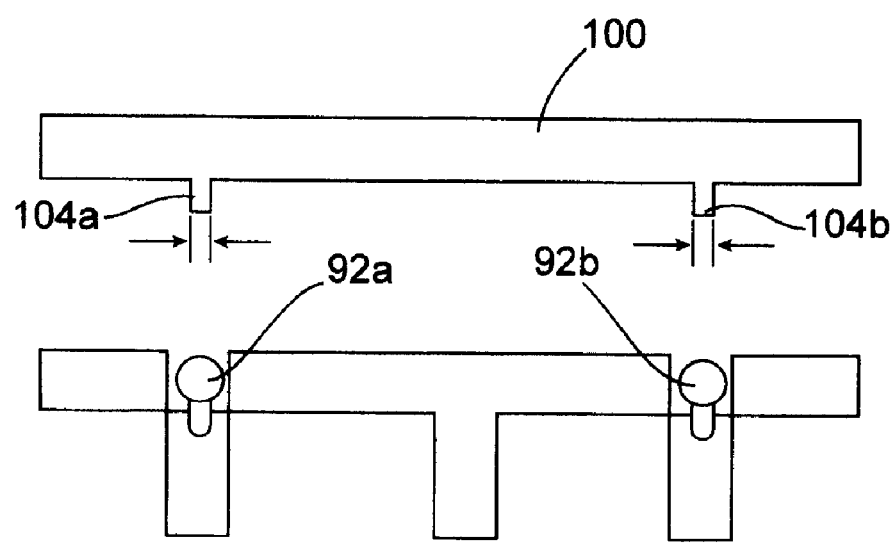
Figure 16G:
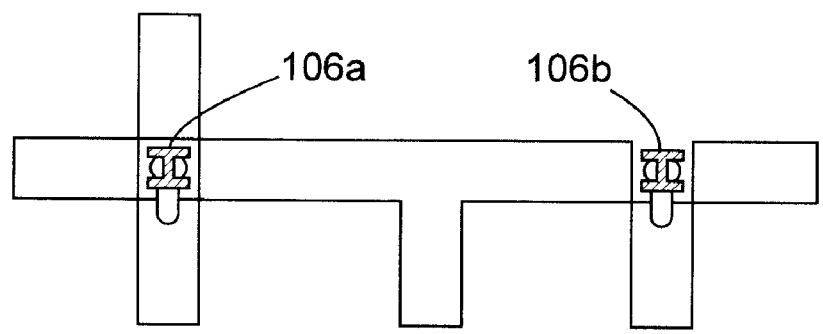
Figure 16H:
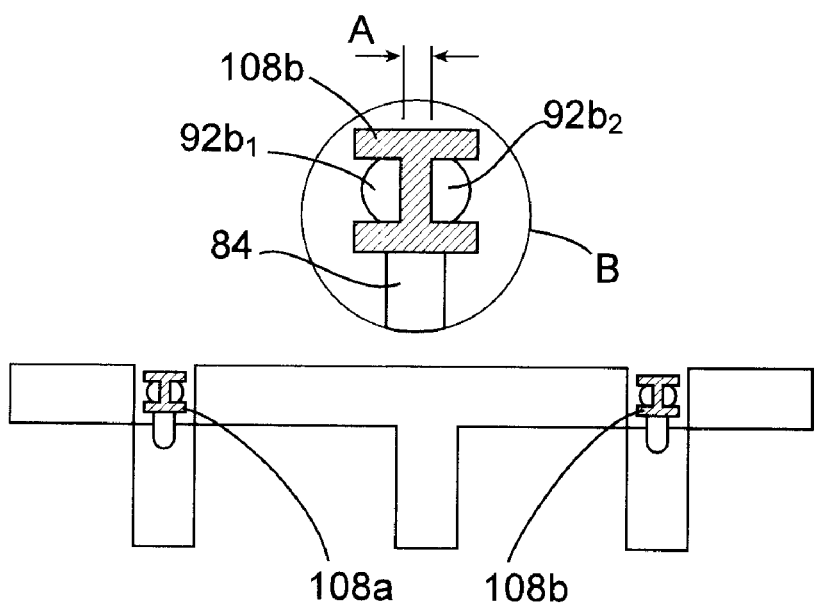
Figure 16I:
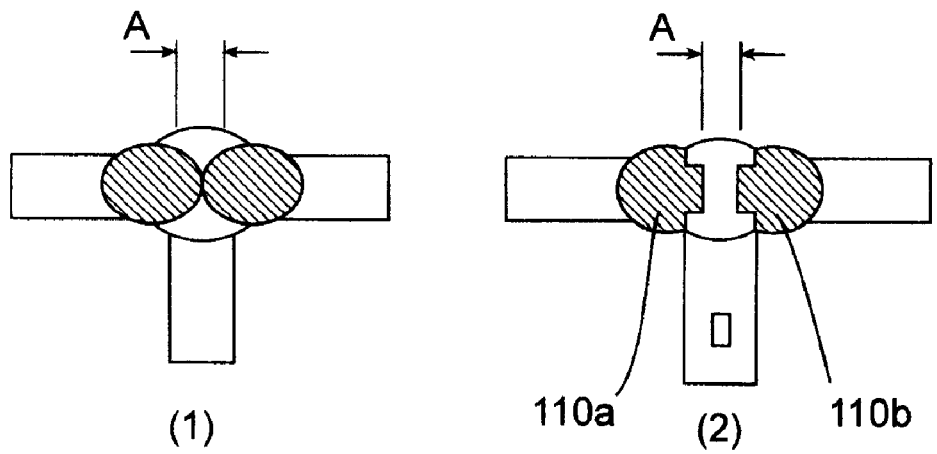
Figure 16J:
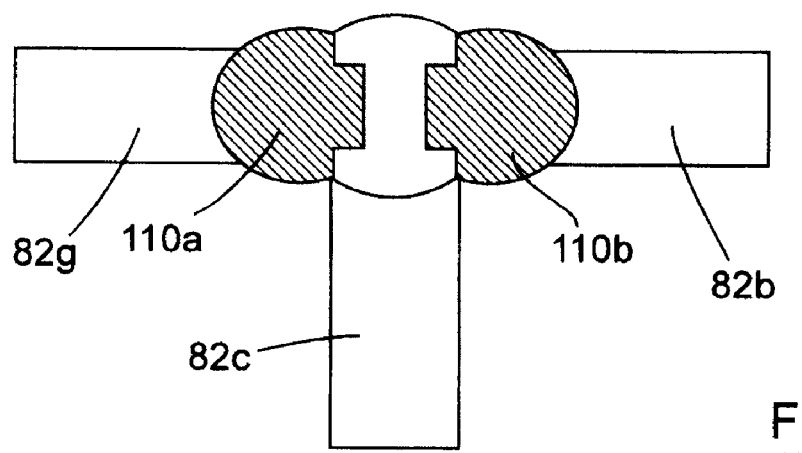
Figure 16K:
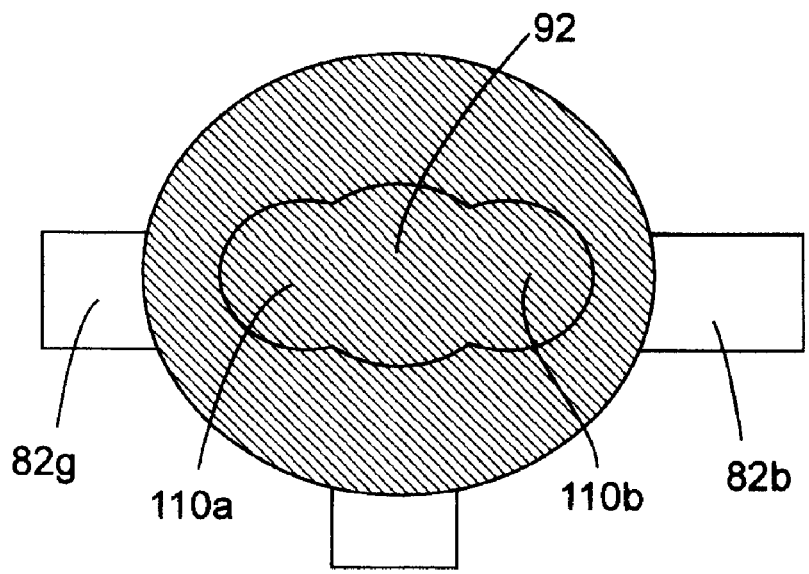
Figure 16L:
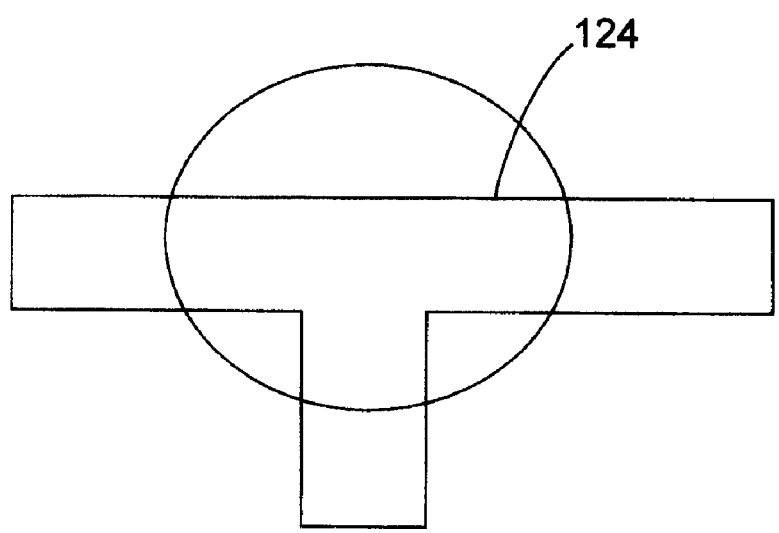
Figure 16M:
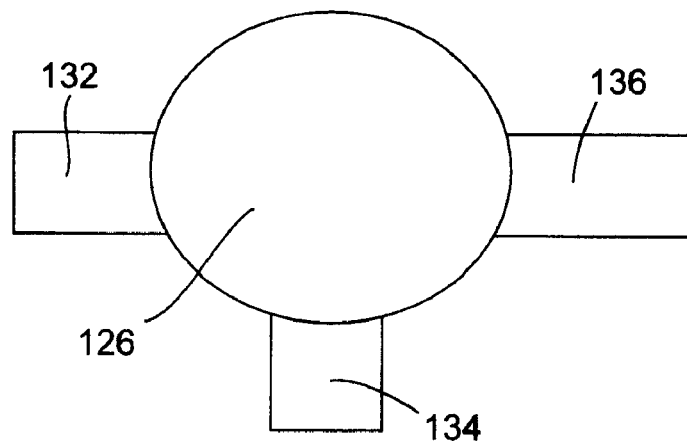
Figure 16N:
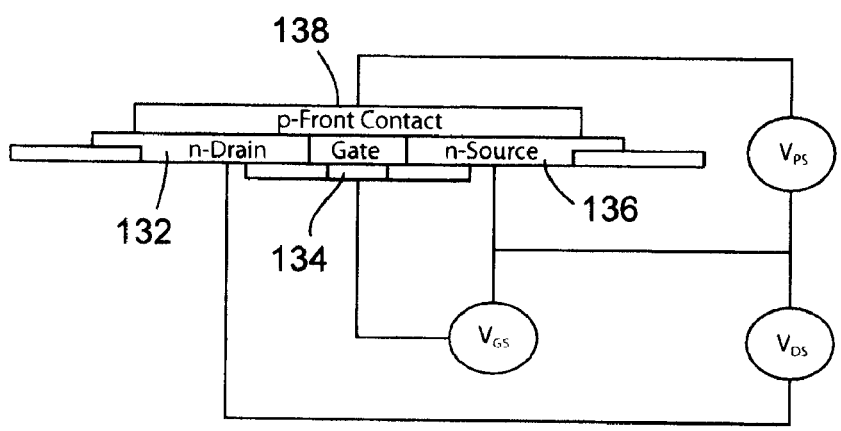

In certain embodiments such inks include a liquid n-type or p-type dopant. Furthermore, such inks may contain a dispersion agent, adapted to stabilise the nanoparticles in suspension in the carrier fluid, and/or a binder material adapted to reduce the migration of the nanoparticles during drying on a non-adsorbent surface.

According to another aspect of the present invention there is provided a method of forming an inorganic dielectric on a substrate comprising the steps of: inkjet printing on a substrate a carrier fluid carrying nanoparticles of an inorganic insulator material; evaporating the carrier fluid so as to leave a powder of nanoparticles; at least partially melting the nanoparticles to generate a substantially continuous film of inorganic dielectric material.

In embodiments of the invention according to the present aspect, such inorganic particles may yield a dielectric structure, film or layer with a performance that is significantly higher than that yielded by organic insulators, such as plastic insulators. In such embodiments, a reduced quantity or thickness of material may be used whilst a high capacitative performance may be retained. In certain embodiments of the invention, the nanoparticles are a metal oxide, such as $Al_2O_3$, $Ti0_2$, or $ZrO_2$ or glass particles.

Furthermore, the method of particle/powder deposition followed by fusing of the deposited particles of dielectric material to generate a substantially continuous film of inorganic dielectric material offers significant advantages over conventional techniques. These include the thermal growth of $SiO_2$, or spin coating of solgel precursors to form glassy materials. Methods of the present embodiment allow accurate placement of the dielectric material. Furthermore, the dielectric material may conveniently be readily applied over large areas without the u se of vacuum furnaces or spin coating systems. Additionally, such methods may be substantially entirely additive, with little wastage. Furthermore, photomasking, associated develop, etch and photo resist removal steps need not be employed.

Preferably, the steps of evaporating and/or melting are carried out using a laser process.

In certain embodiments, at least one dimension of the area on the substrate to be occupied by the nanoparticles is selected using a prior printing step. This may be of the type described above where a hydrophobic material is stamped onto a substrate in soft contact lithographic printing step.

In embodiments of the invention continuous inorganic films, according to this aspect, may form a capacitor or a gate oxide in a metal oxide silicon transistor, for example.

According to another aspect of the present invention there is provided an ink suitable for inkjet printing comprising a suspension of nanoparticles suspended in a carrier fluid, the nanoparticles comprising an inorganic dielectric material.

In inks according to this aspect, the inorganic dielectric material may be a metal oxide, such as $SiO_2$, $Al_2O_3$, $Ti0_2$, or $ZrO_2$, a glass or other suitable material. In certain embodiments of the invention the nanoparticles have a diameter of approximately 3-120 nanometers.

According to another aspect of the present invention there is provided a method of manufacturing a compound film of semiconducting material comprising the steps of: depositing nanoparticles on a substrate; causing the nanoparticles to fuse and recrystallise to form a recrystallised compound film.

In certain embodiments of the present invention according to the present aspect, nanoparticles of one element are deposited on a substrate, which is itself a recrystallised film of semiconducting material. For example, in one embodiment, germanium nanoparticles are deposited, fused and recrystallised on top of a silicon recrystallised film; thus, giving rise to a SiGe recrystallised compound film. In this manner, low cost, high frequency devices such as hetrojunction bipolar transistors may be readily fabricated without using the costly, process of chemical vapour deposition currently used. Furthermore, producing such compound films according to embodiments of the invention, other disadvantages of chemical vapour deposition may be avoided. These include, for example, restricted sizes and relatively high number of process steps etc.

In certain embodiments, the substrate, in this case the silicon recrystallised film, is itself manufactured in a prior step of depositing silicon nanoparticles on a further substrate and fusing and recrystallise the silicon nanoparticles.

In other embodiments, according to this aspect of the invention, such compound films are created by depositing a mixture of silicon and germanium nanoparticles (clearly other nanoparticles of other elements can be used as required), on the same substrate, to form a single layer of mixed nanoparticles. By fusing and recrystallising this mixed layer of particles a recrystallised compound film may also be formed.

In other embodiments, according tot his aspect of the invention, such compound films are created by depositing a layer of nanoparticles, of which at least some contain atoms of two distinct materials, for example, silicon and germanium. This layer of nanoparticles may be fused and recrystallised, again giving rise to a recrystallised compound film.

In preferred embodiments of the invention, inkjet printing techniques are used to precisely deliver of fluids carrying nanoparticles of inorganic semiconductor materials and dopants, insulator, conductor, or electrode material etc. on to the surface of the substrate to build up electronic components and circuits. In other embodiments, other printing techniques such as offset lithographic (photogravure) or digital offset printing methods are employed. Using such techniques allows the use of specific high performance materials with which relatively high performance electronic circuits may be produced; thus, providing performance that is significantly higher that than of circuits using semi-conducting polymers, for example. For example, high electron mobility doped silicon or germanium, for use in transistor gates may be employed, together with high conductivity gold and copper contacts. Preferably this is carried out in a completely, or substantially completely, additive process, without the use of expensive or dangerous chemicals. Thus, lower materials costs are incurred and little waste is produced. Consequently, methods according to the invention may have a reduced environmental impact compared to conventional methods.

In certain embodiments of the present aspect of the invention, inkjet deposition techniques and laser heat processing are used.

The present invention also extends to the apparatus for manufacturing electronics components, such as transistors, or resistors, or capacitors corresponding to the claimed methods, as well as circuits comprising such components.

Furthermore, the present invention extends to electronic components, such as transistors, or resistors, or capacitors and their component parts, manufactured in accordance with the present invention, or circuits incorporating such electronic components.

The present invention also extends to computer programs, arranged to implement the methods of the present invention.

Further aspects of the invention will be apparent form the following description and appended claims.

BRIEF DESCRIPTION OF THE DRAWINGS

For a better understanding of the invention and to show how the same may be carried into effect, there will now be described by way of example only, specific embodiments, methods and processes according to the present invention with reference to the accompanying drawings in which:

FIGS. 1 to 6 schematically illustrate the fabrication process of a stamp suitable for use in accordance with one embodiment of the present invention;

FIGS. 7 to 15 schematically illustrate the process by which a stamp may be inked, aligned with and printed on a substrate in accordance with one embodiment of the present invention;

FIGS. 16a-n schematically illustrates a method of constructing transistors according to one embodiment of the invention;

FIGS. 17a-h schematically illustrate a method of constructing resistors according to one embodiment of the invention; and, FIGS. 18a-k schematically illustrates a method of constructing capacitors according to one embodiment of the invention.

DETAILED DESCRIPTION OF THE BEST MODE FOR CARRYING OUT THE INVENTION

There will now be described examples of the best mode contemplated by the inventors for carrying out the invention.

As has been described above, in preferred embodiments of the invention stamps are inked such that they retain a hydrophobic, liquid on features of their surfaces. The hydrophobic liquid is then transferred through a soft-contact-lithography stamping, or printing process to the desired location on a substrate on which one or more electronic components or circuits are to be constructed. When this same area has hydrophilic solutions or inks deposited on it or adjacent to it, separation occurs between the hydrophobic and hydrophilic regions. This technique is used in preferred embodiments to help define specific or critical dimensions of electrical components such as the dimensions of gates for transistors.

Below, the manufacturing process for a stamp for use in the present embodiment is described, as are suitable techniques for inking and aligning the manufactured stamp, prior to carrying out a stamping operation. Subsequently, apparatus and processes for manufacturing three different types of electronic components according to the methods of the present embodiment are described. These components are: transistors; capacitors; and, resistors.

Manufacture of Stamp

Figure 2:
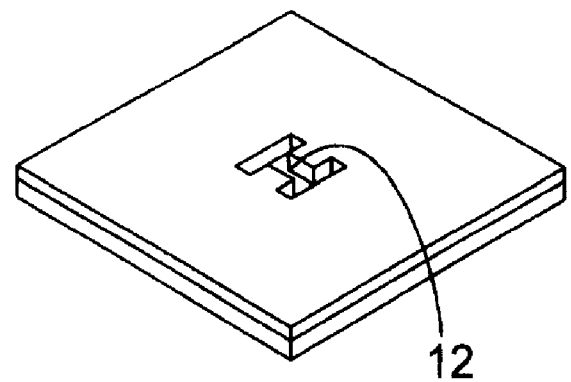

Referring to FIG. 1a, a small section of conventional silicon wafer 2 is illustrated. The wafer is covered a conventional photoresist material 4. The photo resist is then exposed through a mask 6, illustrated in FIG. 1b, with the shape 8 of the desired stamp feature. Any suitable type of mask may be used, for example a chrome mask. In this manner, all of the photo resist on the wafer may be exposed or cured except the area 10 corresponding to the pattern. The uncured photo resist is then washed away, leaving a cut out or recess 12 corresponding to the shape of the desired stamp. This forms a mould as is illustrated in FIG. 2.

A suitable material for manufacturing the stamp is then prepared. In this example, a PDMS (polydimethylsiloxane) material, a synthetic polymer of repeating [(CH)$_3$SiO] units, is used. A suitable commercially available PDMS system is Sylgard Elastomer 184™, available from Dow Corning™. This material is supplied as a 2-part kit comprising of a base and a curing agent. Combining the base and curing agent together causes a reaction. The relative proportions of the base and the curing agent determine the degree of cross-linking; which in turn determines the hardness or softness of the material.

Figure 3:
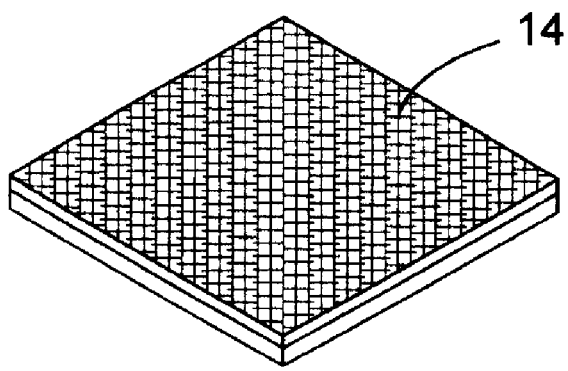

The required hardness of the PDMS material may be determined by experimentation, to match particular operational requirements. However, it has been found that one suitable preparation of the PDMS material is obtained by mixing the base and curing agent solution of the PDMS in the ratio of 1 part of curing agent to 10 parts of base material. This is stirred to ensure a homogenous mixture and set aside for 15 minutes to allow bubbles to be expelled. The prepared PDMS mixture 14 is poured onto the mould, as is illustrated in FIG. 3, and set aside for 15 minutes to allow gas bubbles to be expelled. The PDMS is then cured at 130° C. for 20 minutes in a conventional manner.

Figure 4:
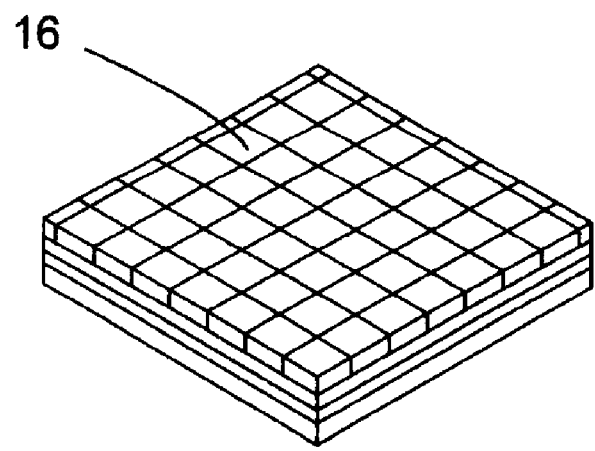
Figure 5:
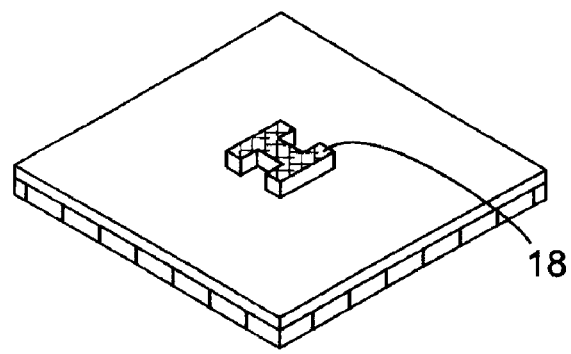
Figure 6:
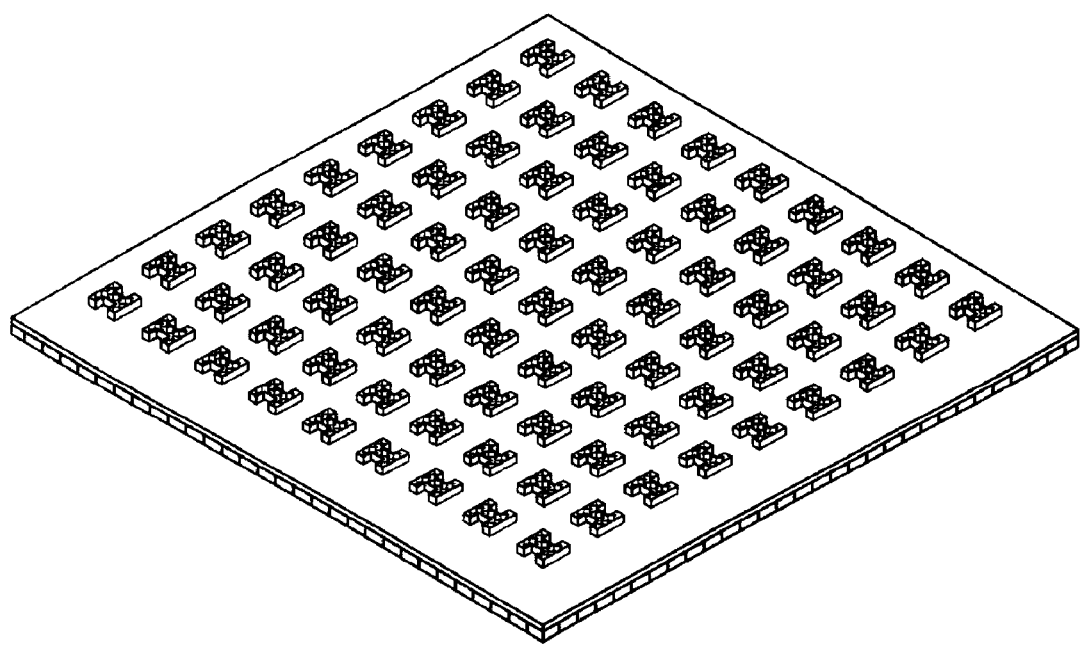

An aluminum backing plate 16 is subsequently bonded onto the cured PDMS as is illustrated in FIG. 4. The cured PDMS together with the aluminum backing plate is then removed to reveal a positive, soft stamping structure 18, illustrated in FIG. 5. In this example, only one stamp feature is shown. However, in practice a complete stamp may be fully populated with features, as is schematically illustrated in FIG. 6.

Inking of Stamp

FIGS. 7a and 7b illustrate a side view and a plan view, respectively, of an apparatus used to ink the stamp in the present embodiment. As can be seen from the figures, the PDMS stamp 18 is located in a frame 20, which in turn is mounted on four vertical bearing shafts 22. A motorised vertical or Z axis 24 is also provided to allow the stamp to be precisely raised and lower over a range of approximately 4 millimeters in the present embodiment. In this example, the motorised Z axis is provided by a stepper motor 24a and lead screw 24b.

Beneath the stamp 18 and the frame 20, and attached to the frame by two linear slides (not shown), is a moveable stainless steel flat plate or tray 26, that has a recessed area 28 slightly bigger than the stamp. In this example, the recessed area is milled down to a depth of approximately ten microns. This area provides a recess arranged to retain the hydrophobic liquid or ink. Above the tray and laterally offset to the stamp is an array of conventional air assisted micro-dispensing nozzles 30. Parallel to the array of nozzles is a conventional PDMS squeegee or doctor-blade 32.

The process by which the stamp may be inked will now be described with reference to FIGS. 7 to 13, which show the apparatus used to ink the stamp during different stages of the inking process. It will be noted that FIGS. 8a, 9a and 10a each show a side view of the apparatus, corresponding to that shown in FIG. 7a and that FIGS. 8b, 9b and 10b each show a side view of the apparatus, corresponding to that shown in FIG. 7b.

Figure 7:
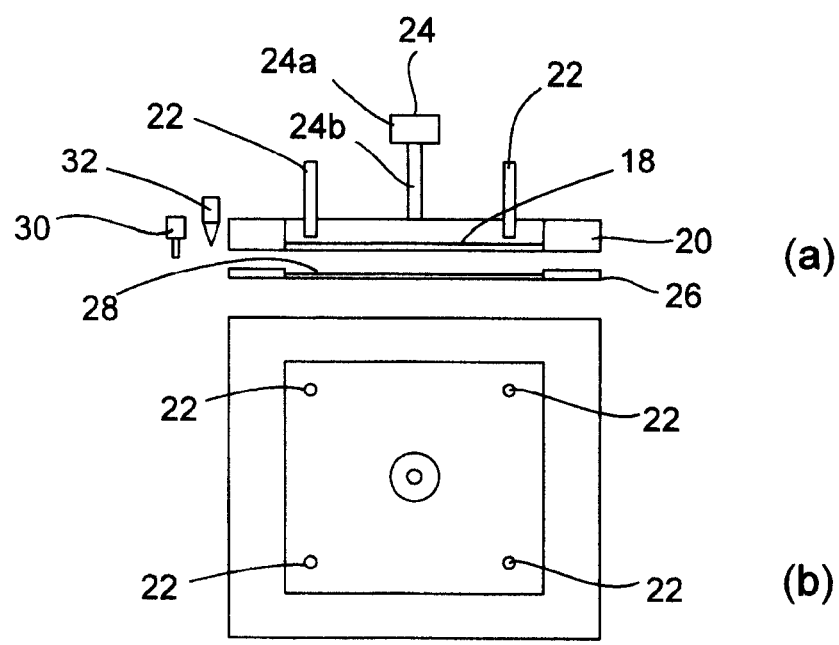
Figure 8:
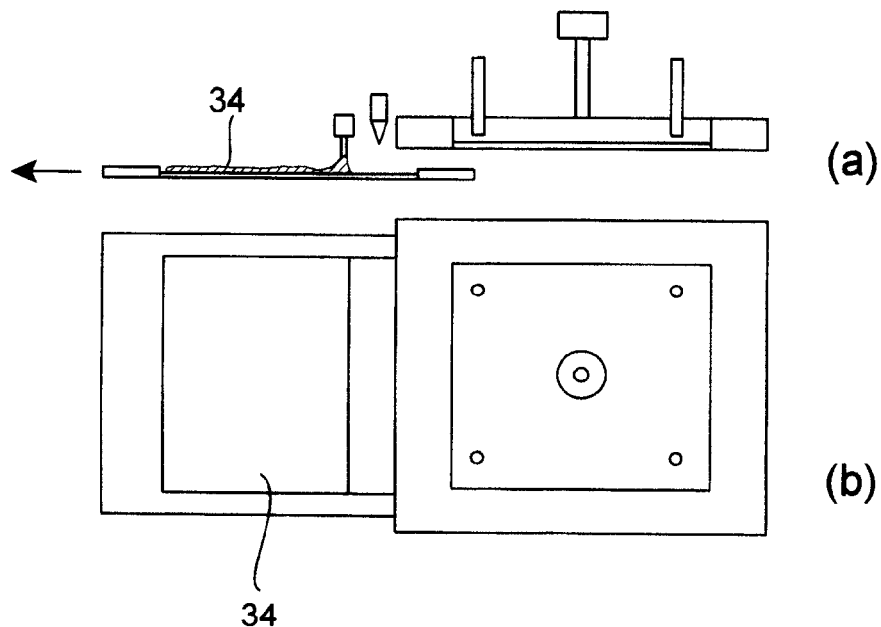
Figure 9:
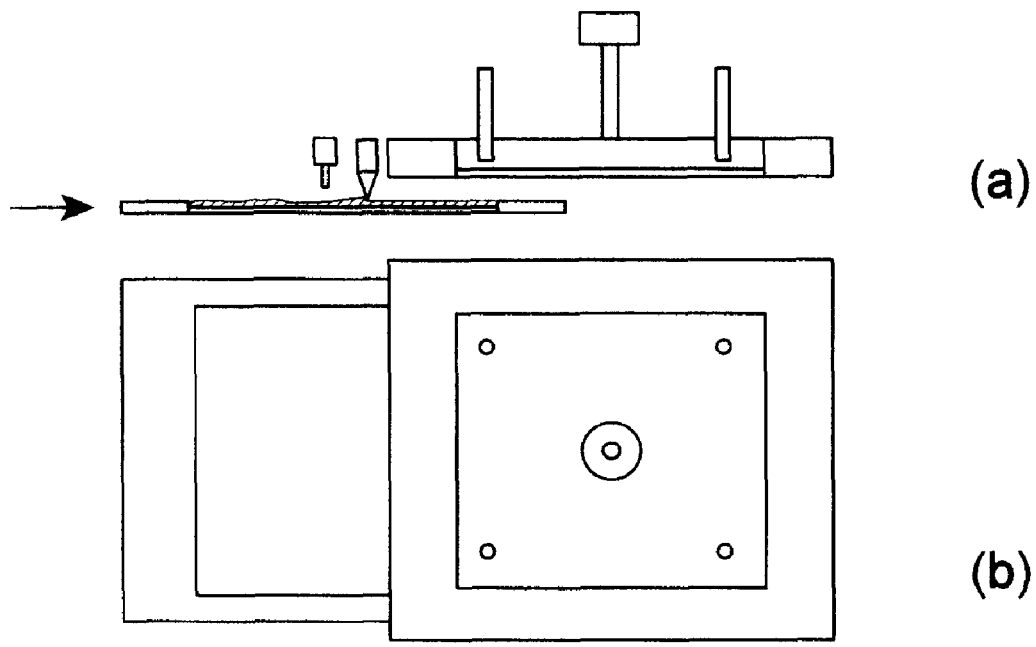

The operation of the inking cycle commences with the inking apparatus in the "load" position, as illustrated in FIG. 7, with the tray, with no ink in it, located under the stamp.

The tray then unloads, as is illustrated in FIGS. 8a and 8b, the tray passing beneath the array of nozzles 30 in the direction of the arrow in FIG. 8a. As it does so, the nozzles dispense hydrophobic liquid or ink 34, eventually covering the entire recessed surface of the tray. In this example, the hydrophobic liquid 34 is a paraffin wax dissolved in a low boiling point solvent such as toluene, although any other suitable material may alternatively be used. In the present embodiment, the hydrophobic liquid 34 contains a conventional fluorescent marker dye. This facilitates the process of identifying the location of the hydrophobic liquid 34 once it has been transferred or stamped onto a substrate. As can be seen from the figures, the squeegee 32 and the stamp 18 are in their raised positions during this unloading phase.

Figure 10:
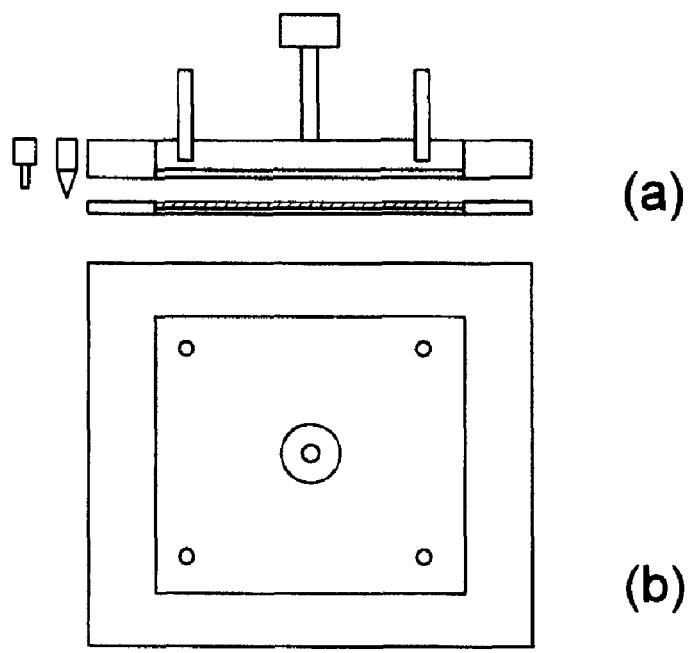
Figure 11:
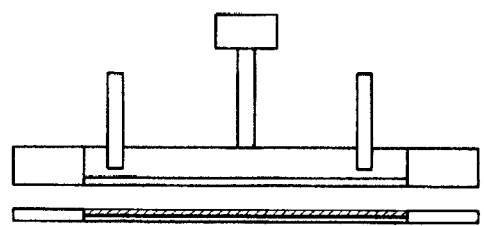
Figure 12:
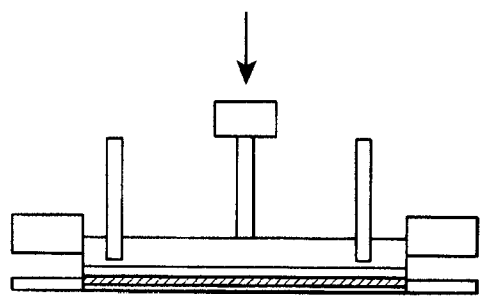
Figure 13:
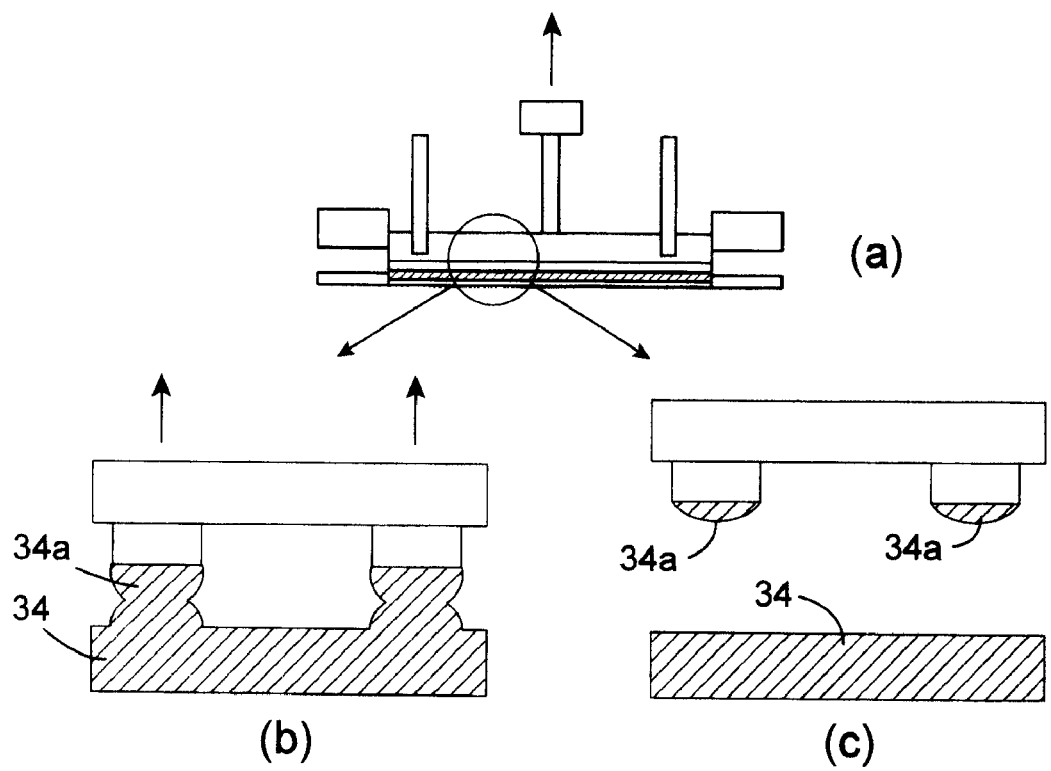

The tray then loads once again; i.e. moves in the direction of the arrow in FIG. 9a. During this loading phase, the stamp is in its raised position but the squeegee 32 is lowered. As the tray is loaded, the squeegee wipes excess ink from the entire recessed tray surface, leaving a uniform thickness of ink on the tray, as is illustrated in FIG. 10.

On completion of the loading phase, the stamp and inkplate are mutually aligned. The stepper motor then rotates the lead-screw connected to the back of stamp frame, lowering the stamp, as is indicated by the arrow in FIG. 12. The stamp is lowered until contact is made between the feature or features on the stamp-face and the ink. Only the features on the face of the stamp are brought into contact with the ink in the tray.

The stamp is then withdrawn at a controlled rate as is illustrated by the arrow in FIG. 13a. This allows the surface tension to separate the ink on the face of the stamp from that in the tray. This is illustrated by the FIGS. 13b and 13c, which illustrate an enlarged view of the circle area in FIG. 13a. FIG. 13b shows the progressive separation of the of the ink 34a on the stamp from the ink 34 in the tray under the effect of surface tension as the stamp moves away from the tray in the direction indicated by the arrows in the figure. FIG. 13c illustrates the ink 34a retained on the features of the stamp when the stamp has been fully withdrawn from the tray. Although other inking processes may be used, the inking process described gives repeatable results in terms of the amount of ink that is loaded onto the stamp.

Alignment and Printing of Stamp

Once a stamp has been loaded with ink, it is ready to be aligned with a substrate on which one or more electronic components circuits are to be constructed, so that the ink may be transferred to the substrate. This process will now be described with reference to FIGS. 14a, 15a and 15b.

FIG. 14a illustrates the apparatus used in the present embodiment to position and align a stamp with the substrate such that the ink on the stamp may be applied to the substrate. As can be seen from the figure, the combined stamp and tray assembly, shown in FIGS. 7 to 13, is mounted on a scanning carriage 38. In FIG. 14a the combined stamp and tray assembly is referenced 36. The scanning carriage is arranged to move a long two parallel guides 40, by virtue of a conventional drive motor. A code strip 42a and a code strip reader 42b are used to register the position of the carriage in the scanning, or "X" direction. The substrate (not shown) may be moved as a pre-cut sheet or from a roll in the "Y" direction, perpendicular to the "X" direction, as is indicated in the figure. This may be achieved using a conventional media feeding system (not shown) arranged to feed the substrate over a conventional supporting surface or platen, which supports the substrate whilst being printed on. The scanning carriage 38, the guides 40, the code strip 42a, the code strip reader 42b, together with the carriage scan axis drive system, the media feed system and platen may be similar or the same as similar components used in conventional printers, such as wide format scanning inkjet printers.

The position of the stamp-tray assembly may be precisely adjusted in the substrate-movement, or "Y" direction, by means of two stepper motor drives 44a and 44b. Also located on the carriage, to either side of the stamp are two cameras 46a and 46b that are connected to a conventional motion-image analysis system 48, or artificial vision system. In the present embodiment, the function of the motion-image analysis system is carried out by a suitable program module or processor module 48 of a suitably programmed general purpose or dedicated computer 54, as is schematically illustrated in the figure. The computer 54 is arranged to input and output data and operating instructions via conventional communications channels, here schematically represented as a cable 56.

Initially, the stamp is positioned and aligned approximately with the desired area of the substrate. This may be carried out manually by the operator of the system, for example. The stamp, which is loaded with ink 34a, in then stamped onto the substrate. This is carried out by lowering the stamp with the motorised vertical or Z axis 24, as described above. During this process, the tray 26 is in a retracted position so as not to obstruct the stroke of the stamp. An alignment/position checking procedure is then carried out by the motion-image analysis to ensure that the stamp was correctly positioned with respect to the substrate and to allow for the correction for any errors in the alignment/position of the stamp that may be required. This is carried out in the following manner.

In the present embodiment, in addition to printing hydrophobic regions that define critical dimensions of electronic components, the stamp is arranged to print in a stamping operation a pair of test boxes, or other suitable shapes or patterns. The substrate has pre-printed on it a number of corresponding pairs of test boxes in known positions. The test boxes of the stamp and the substrate are arranged such that when the stamp is printed in the correct position and orientation relative to the substrate, the two sets of test boxes will be arranged in a predetermined, and measurable position and orientation with respect to each other.

This process is illustrated in FIG. 15. In FIG. 15a, two test boxes 58a and 58b, which have been pre-printed on the substrate, are shown. Two smaller hydrophobic test boxes 60a and 60b, printed in an alignment/position check procedure by the stamp are also shown. As can be seen from the figure, in this example the test boxes 60a and 60b each lie inside their corresponding pre-printed test boxes 58a and 58b, respectively. However, the test boxes 60a and 60b do not lie centrally inside their corresponding pre-printed test boxes. This indicates that the stamp is not yet correctly aligned with respect to the substrate. The relative positions of the test boxes are determined by moving the carriage so that the cameras 46a and 46b can image the test boxes 58a, 58b, 60a and 60b. UV light and conventional filters are used to enhance the imaging of the fluorescent inked boxes. The output of the cameras 46a and 46b is output to the motion-image analysis system 48 for analysis. In this manner, printed box in substrate box (called box-in-box) X, Y and skew alignment errors are determined in a conventional manner.

The stamp to substrate skew (rotational error) is calculated and minimised by moving the right hand stepper motor that results in a pivoting of the stamp. The stamp to substrate XY registration error is then determined. The required correction values are then determined to minimise this registration error.

The scanning carriage assembly then moves in the X direction, across the substrate, to the next printing or stamping location, which is at a designed pitch distance from the first printing location. Preferably, the pre-printed pairs of test boxes on the substrate are repeated across the substrate, separated by a predetermined pitch distance. In this manner, after every stamping operation, the position and orientation of the stamp relative to the substrate may be determined and corrected for if required. Before a further stamping process is implemented, the carriage is readjusted in the "X" direction by moving the carriage relative to the guides, and in the "Y" direction by moving the stepper motors 44a and 44b. A further stamping process is then implemented after reloading the stamp with ink as described above. Further measurements of box-in-box alignment may take place as is required. This is illustrated in FIG. 15b, where it can be seen that the smaller hydrophobic test boxes 60a and 60b now each lie centrally and at the correct orientation with respect to their corresponding pre-printed test boxes 58a and 58b; indicating that the stamp is now satisfactorily aligned with respect to the substrate. The applicant has determined that using the described method and apparatus, XY errors of less than 2 microns and a skew error of less than 0.5 degrees are obtainable.

By using a contact lithographic printing process to define one or more dimensions in an electronic component, various advantages may be realised. In embodiments of the present invention, accurately manufactured electronic components may be fabricated without the need for expensive photomasks, as in conventional in electronics manufacture. This in itself brings important benefits. Photomasks or screen printing masks of a size of 6 inches by 6 inches currently may cost thousands of dollars, and once made, the design of a photomask or of a screen printing masks is fixed. Thus, as new circuit designs are required, possibly with slight repositioning of components, new masks must be produced. Thus, by obviating the need for such masks, appreciable cost savings may be made. Furthermore, photomasks or a screen printing masks suffer from the disadvantage of covering a relatively small area. The maximum size of such masks is limited, which in turn constrains the use to which they may be put. Furthermore, by eliminating the need for photomasks, other conventional processes used in the fabrication of electronics such as exposing, developing, etching and dopant implantation may also be eliminated in embodiments of the present invention. Consequently, the reliance upon a clean room environment and hazardous chemical may be avoided. In this manner, the cost of electronic components or circuits according to embodiments of the invention may be significantly less that of conventionally produced components or circuits.

In embodiments of the present invention, electronic circuits, which include electronic components according to embodiments of the invention, may be constructed in an integrated manner. Circuits according to certain embodiments of the invention may be constructed on a wide range of substrates, including substrates other than silicon; for example, large dimensioned sheets of metals or plastic materials. This means that comparatively large circuits may relatively readily be produced. Furthermore, by using a flexible substrate, electronics components and circuits according to embodiments of the present invention are suitable for use in fields where non-rigid electronic circuitry is required; for example clothing or retail.

Examples of processes used to manufacture three different types of electronic components according to the present embodiment will now be described. In each case, various processes may be involved in addition to area selection using hydrophobic stamps as is described above. These processes include, the delivery of fluid carrying nanoparticles of semi-conductor, insulator, conductor, or electrode material, and their subsequent annealing, and recrystallization using lasers. Although, the processes for manufacturing electronic components according to embodiments of the present invention may take many forms, from very small scale essentially manual operations up to fully equipped production lines, in the p resent example, a line process is described.

Figure 14B:
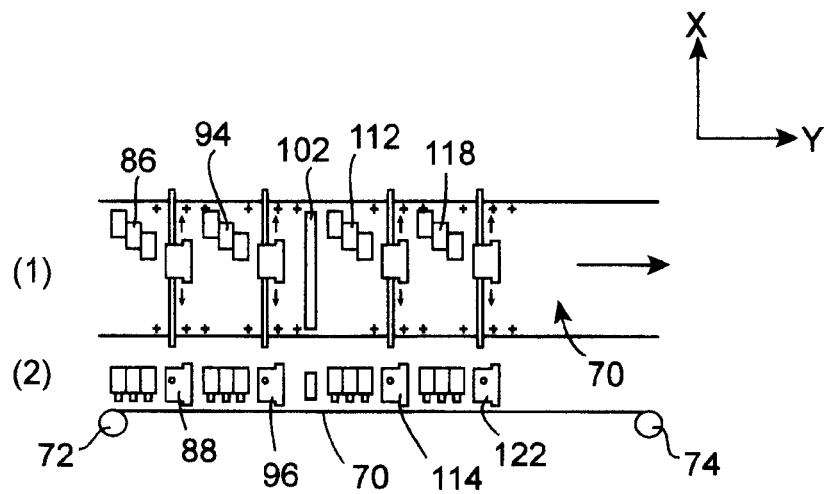
Figure 14C:
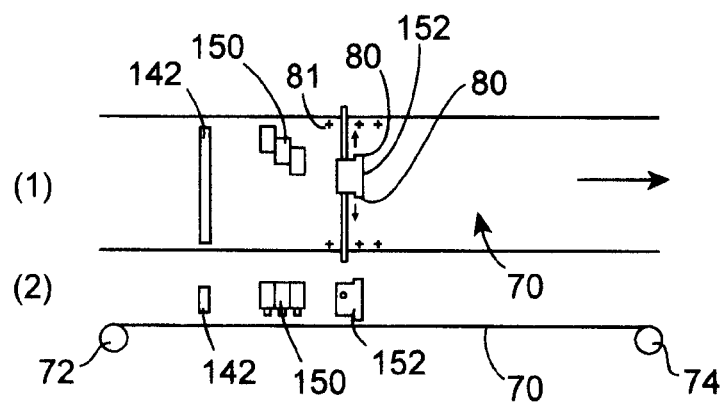
Figure 14D:
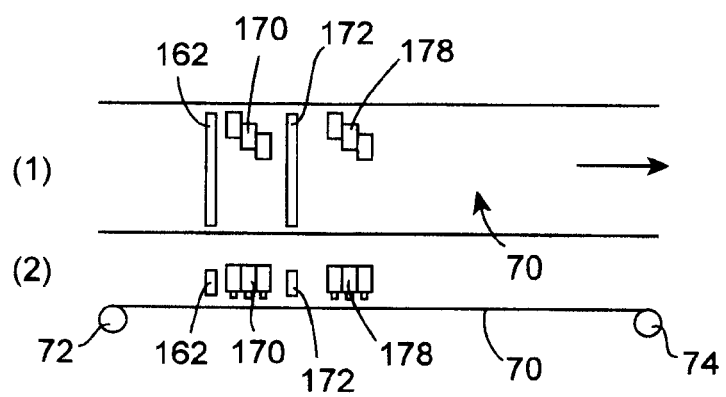

FIGS. 14b, 14c and 14d illustrate the lines used in the present embodiment of the invention to manufacture transistors, resistor and capacitors respectively. Although each of these lines is illustrated as being a separate line, this is only for ease of explanation. In practice, the process stages of each of the lines illustrated in FIGS. 14b, 14c and 14d may be combined such that one line may produce each of the three types of electronic components, integrated in electronic circuits for example.

Each of the lines illustrated in FIGS. 14b, 14c and 14d illustrate two views of the respective line process. FIGS. $14b_1$, $14c_1$ and $14d_1$ illustrate the respective processes in plan view. FIGS. $14b_2$, $14c_2$ and $14d_2$ illustrate the respective processes in side view. The three processes share a number of common features. These will be explained together. A moving substrate 70 is driven conventionally from a first roller 72 to a second roller 74, in the direction of the arrow. This corresponds to the "Y" direction illustrated in FIG. 14a. In the present example, the substrate 70 is a flexible sheet, which is supported on a suitable platen (not shown). The substrate 70 may be any suitable material, for example polyethylene terephthalate (PET). In some embodiments, the PET or similar material may be coated in a thermal barrier such as silica. However, in other examples, rigid, or non-flexible substrates such as silicon may instead be used, in conjunction with a suitable transport path. Furthermore, suitable substrates may include steel or nickel, for example, coated in dielectric such as alumina or silica.

Various operations are carried out on the substrate located between the rollers 72 and 74. Preferably, these operations are implemented whilst the substrate is moving. In this manner, a constant substrate feed may be maintained throughout the manufacturing process. However, the substrate may alternatively be stopped to allow certain operations to be performed when required. These operations are implemented by various process stations, which span the substrate, between the rollers 72 and 74, in the "X" direction. The process stations are arranged from left to right in the "Y" direction in the order in which they are employed in the respective process.

Each of the three line processes includes at least one soft contact lithographic process station (for example station 102 in FIG. 14b) with apparatus corresponding to that described above with reference to FIG. 14a.

Each of the line processes includes one or more inkjet stations (for example station 86 in FIG. 14b). Each inkjet station has a number of printheads, which are arranged to eject drops of ink or other substances onto the substrate. The printheads are connected via a conventional ink supply system to a supply of ink or other liquid required to be printed by the given printheads. These may be of conventional design, such as those described in U.S. Pat. Nos. 5,278,584 and 4,683,481, both assigned to Hewlett-Packard Company; both of which are hereby incorporated by reference in their entirety. Although thermal inkjet printheads are employed in the present embodiment, other types of printheads, such as piezoelectric printheads, may alternatively be used. In the present embodiment, the activation and positioning of the individual nozzles of the inkjet printheads at each station are under the control of a print controller. In the present embodiment, the function of the print controller is carried out by a suitable program module or processor module 52 of a suitably programmed general purpose or dedicated computer 54, as is schematically illustrated in FIG. 14a. The program module 52 controls the inkjet nozzles in a conventional manner, i.e. by outputting firing signals to selected inkjet nozzles of selected printheads causing them to fire at the appropriate times to deposit a given liquid at the desired locations on the substrate.

Certain line processes include one or more laser stations (for example station 96 in FIG. 14b). These are used to carry out processes such as the drying, removal of organic residue, melting, annealing, recrystallization, trimming and of materials on the substrate. In the present invention, each laser station is equipped with a pair of cameras 80 (referenced in FIG. 14*c*) the output of which are connected to the motion-image analysis system 48.

The process stations are configured in the present embodiments to traverse the substrate in the "X" direction, so as to access the correct portion of the substrate.

This may be carried out in any convenient manner. For example, conventional scanning inkjet assemblies may be used. These may employ the architecture (not shown) of conventional wide format scanning inkjet printers. This architecture is well understood by the skilled reader and so will not be described in detail here. However, it may include, a scanning carriage mounted on guide rails, which form the scanning axis. A conventional carriage scan axis drive system may be used to propel the carriage along the axis. A code strip reader mounted on the carriage may be used to read a static code strip mounted parallel to the scanning axis. In this manner, carriage position and speed information may derive. Again the "X" axis position control is controlled by the computer 54.

Alternatively, in the case of the inkjet stations, printheads arranged in the form of print bars or arrays of printheads that are statically mounted, such that they span the required width of the substrate in the X-axis, may instead be used. Examples of print bars suitable for use in the present embodiment are disclosed in: U.S. Pat. No. 6,428,145 B1, entitled "Wide-array inkjet printhead assembly with internal electrical routing system"; U.S. Pat. No. 5,719,602 A1, entitled "Controlling PWA inkjet nozzle timing as a function of media speed"; and, U.S. Pat. No. 5,734,394 A1, entitled "Kinematically fixing flex circuit to PWA printbar". Each of these references is in the name of Hewlett-Packard Co. and is hereby incorporated by reference in its entirety.

In the case of the laser stations, the analysis of the motion-image analysis system 48 is used by the computer 52 to precisely control the movement of each of the laser stations in the "X" direction, such that the laser in question is correctly positioned relative to a feature of interest on the substrate. The correct positioning of the lasers is determined relative to conventional vision alignment marks 81, referenced in FIG. 14*c*. Each of the lasers of the laser stations may be pulsed on and off under the control of a laser controller, in order to implement the process of the corresponding laser station. In the present embodiment, the function of the laser controller is carried out by a suitable program module or processor module 50 of a suitably programmed general purpose or dedicated computer 54, as is schematically illustrated in FIG. 14*a*.

In general, the processes of the present embodiment are controlled by the computer 54. Thus, the computer 54 is arranged to input and output a variety of data and operating instructions in a conventional manner. For example, it may input operating instructions from an operator, signals output by the cameras, position information output by the code strip reader or the substrate feed mechanism. The computer 54 may also, for example, output drive signals to the carriage scan axis drive system, the substrate feed system, fire signals to the inkjet printheads, printing and inking actuation commands to the combined stamp and tray assembly, and drive commands to the stepper motors and operational information to an operator.

Manufacture of a Transistor

Referring to FIGS. 16*a-o* together with FIG. 14*b*, the method of constructing transistors according to the present embodiment of the invention will now be described.

FIG. 16*a* illustrates a portion of the substrate 70 upon which one or more transistors are to be constructed. As can be seen from the figure, the substrate 70 has been pre-patterned with copper tracks 82. The copper tracks have been laid out in pre-determined positions, forming part of an electronic circuit into which two transistors will be integrated. Any conventional method of manufacturing the copper tracks, such as traditional flex-circuit printed circuit board processing technology, may be used.

The next step of the construction of the transistors is to form a contact 84 for the gate oxide of each transistor. In this example, the contacts are formed from a suspension of gold (Au) nanoparticles, which are printed onto the surface of the substrate using one or more inkjet printheads 86 at the first inkjet station, shown in FIG. 14*b*. In this example, two transistors are constructed, therefore, two such contacts 84*a* and 84*b* are formed, as is illustrated in FIG. 16*b*. In the present embodiment, the gold nanoparticles are suspended in water and are stabilised though the use of a water-soluble thiol ligand. The thiol interacts with the surface of the gold via chemisorption, however, any other suitable solution may instead be used. Additional additives may be included in the suspension to improve the performance of the fluid for inkjet printing. Examples of these include humectants such as 2-pyrollidinone or 1-3 propane diol though other suitable additives may also be used. As can be seen from the figures, one end of the contact 84*a* is in electrical contact with an adjacent portion 82*c* of copper tracks. The other end of the contact 84*a* extends to a point on the substrate where the gate oxide of the transistor will be formed. This is approximately equidistant between the copper track portions 82*g*, 82*c* and 82*b*, which will connect to the drain, the gate and the source, of the transistor respectively. It will be noted that the contact 84*a* does not make electrical contact with the portions 82*a*, 82*b* and 82*a*. The contact 84*b* is similarly arranged relative to the portions of copper track 82*d-f*, as is shown in the figure.

The gold particles of the contacts 84*a* and 84*b* are then treated with a laser to force the removal of the capping ligand and to melt the gold to form a continuous film using the laser 88 of the first laser station shown in FIG. 14*b*. This may be done in any suitable manner. For example, using a low fluence (150 to 350 mJ/cm$^2$) Xenon Chloride pulsed eximer laser (wavelength=308 nm, pulse duration=35 ns). This process is illustrated in FIG. 16*c*, where areas 90*a* and 90*b* indicate approximately the areas influenced by the laser.

The gate oxides 92*a* and 92*b* are then formed in the case of both transistors, as is shown in FIG. 16*d*. The gate oxide is formed from particles of silicon dioxide, $SiO_2$, which are printed in an aqueous suspension by one or more inkjet printheads 94 at the second inkjet station, shown in FIG. 14*b*. It will be noted that each gate oxide 92*a* and 92*b* is printed in electrical contact with its respective gate oxide contact portion 84*a*, 84*b* but not in electrical contact with the portions of copper track 84*a*, 84*b*, 84*g* or 84*d*, 84*f*.

In the present embodiment the silicon dioxide particles are suspended in water using a non-ionic surfactant such as polyethylene glycol (MW 200) as a dispersant. Additives may include either or both of humectants for improved inkjet performance; and, binders to reduce the migration of particles during drying on a non-absorbent surface. In the present embodiment humectants such as 2-pyrollidinone and 1-3 propanediol and organic binders such as polyvinyl alcohol, and hydroxypropylcellulose are included in the suspension, although materials with similar chemical properties may also be used. In the present embodiment, 2.5% by weight of particles to carrier fluid is used and 30% by volume of dispersant to carrier fluid is used. Clearly, these values may be varied considerably, depending upon the operational set up used. In other embodiments UV curable monomers, such as poly methylmethacrylate, UV treated post deposition could instead be used as a binder.

In the present embodiment, the $SiO_2$ particles have a diameter of less than 100 nm. However, particles which are larger than 100 nm in diameter may alternatively be used. Preferably, the particles are poly-dispersed; i.e. the particles used have a range of diameters, which allows for a high packing density. As will be understood by the skilled reader, it is preferable that particles used are of relatively high purity since they are to function as a dielectric. Suitable $SiO_2$ particles may be obtained from Nano-Structures and Amorphous Materials Inc. Los Alamos U.S.

Although in the present embodiment silicon dioxide is used to form the material of the gate oxides 92a and 92b, other suitable dielectric materials may instead be used. Such alternative materials may include metal oxides such as $Al2O_3$, $TiO_2$ and $ZrO_2$ and other materials such as glass particles.

The gate oxides 92a and 92b are subsequently treated to cause drying, removal of organic additives, and melting to cause a continuous film. This is carried out by the laser of the second laser station 96 shown in FIG. 14b. The areas 98a and 98b, shown in FIG. 16e, illustrate the approximate areas influenced by the laser during this process.

This may be implemented in the same manner as described above with regard to the melting of the gate contacts 84a and 84b. The laser power, wavelength, and pulse width required for efficient melting may be determined experimentally, for a given operational set up. However, the power may generally be within the range of 100-500 mJ·cm$^{-2}$, using a laser wavelength in the range of 248 nm to 1064 nm. Although, a laser process is used in this embodiment in order to melt the gate oxide material it will be understood that any suitable heating process may instead by used, for example the use of an oven.

It has been found that the use of such inorganic particles, as described in this embodiment, may yield a dielectric film or layer with a performance that is significantly higher than that yielded by organic insulators, such as plastic insulators, since it allows less/thinner material to be used whilst retaining a high capacitative performance. Furthermore, the method of particle/powder deposition followed by fusing of the deposited particles of dielectric material described in used in the present embodiment to generate such films offers significant advantages over conventional techniques used for creating such dielectrics, such as thermal growth of $SiO_2$, or spin coating of solgel precursors to form glassy materials. For example, the method of the present embodiment allows accurate placement of the dielectric material. Furthermore, the dielectric material may be readily applied over large areas without the use of vacuum furnaces or spin coating systems. Additionally, the method of the present embodiment provides flexibility in that it is effectively an entirely additive process with little wastage and requires no photomasking, or associated develop, etch and photo resist removal steps.

A stamp 100 with PDMS stamping features, similar to those shown in FIG. 6 or 7, is used to stamp each gate oxide region with hydrophobic ink, in the manner described above. This stamp is operated at the lithographic printing station 102 in FIG. 14b. As can be seen from FIG. 16f, the stamp has two printing features 104a and 104b used to print hydrophobic ink. Each of the features has a "stripe" or band which is approximately 4 microns wide, as is schematically illustrated in the figure. Each 4 micron width strip, helps to define a dimension of the gate region of the corresponding transistor, as is described below. In the present embodiment, this dimension is the gate length. In other embodiments, the stripe may have other widths, for example 1 to 15 microns. In this manner, gates of transistors with other lengths may be constructed. Indeed, the stamping process may be used to define additionally or alternatively the width of the gate region of the transistors. The features 104a and 104b are aligned with the centre of the gate oxide regions 92a, 92b respectively on the flexible substrate, as is illustrated in the figure prior to the stamping process being implemented.

The stamp is brought into contact with the substrate, as illustrated in FIG. 16g. As can be seen from this figure, each of the features 104a and 104b has the shape of a capital letter "I". These are referenced 106a and 106b in the figure.

When the stamp is removed, a residual hydrophobic region 108a and 108b is left on each gate oxide region. This is illustrated in FIG. 16h. An enlarged view of one of the hydrophobic regions 108b is shown in circle "B". From the enlarged view, it can be seen that the hydrophobic regions cover all of their respective underlying gate oxide region 92 with the exception of two relatively small portions of the gate oxide. In the enlarged view, these regions are referenced $92b_1$ and $92b_2$. These portions lie on either side of the 4 micron wide strip, which forms the upright of the "I". This dimension of the strip is referenced in the figure by arrow "A". The regions. 92a and 92b also lie between the upper and lower horizontal arms of "I".

The subsequent step is to inkjet print an aqueous suspension of nanoparticles of an inorganic semiconductor material 110a and 110b, or suitable alternative, onto either side of the 4 micron wide strip, forming the upright of the "I" 108.

In the present embodiment nanoparticles of group IV elements, such as silicon or germanium are used. Silicon and germanium are known as single element semiconductor materials. These materials have the advantage of superior electrical performance over organic semiconductors, inorganic oxide semiconductors and compound inorganic semiconducting materials such as cadmium selenide. Their superior electrical performance may be in the range of 100 times better than that of both organic semiconductors and inorganic oxide semiconductors, and twice that of compound inorganic semiconducting materials such as cadmium selenide. Furthermore, silicon and germanium are benign materials, unlike materials such as cadmium selenide, which is known to be toxic to humans.

It has been found that the exposure of silicon and germanium nanoparticles to oxygen will cause an undesirable level of oxidation. Silicon in particular readily forms an oxide on contact with air at room temperature, germanium however is less reactive. Because of this tendency, the manufacture and use of nanoparticles of group IV materials is not as straightforward as those of other metals such as gold or group III-VI materials such as cadmium selenide. As is well known, silicon and germanium transistors are conventionally manufactured in a wafer FAB clean room environment using chemical vapour deposition techniques.

Furthermore high temperatures are required to convert the particles to a continuous film. Depending upon the process used in order to convert the particles to a continuous film, the substrate may need to be selected in order to resist the temperatures required. However, the use of particles of reduced size allows the use of lower processing temperatures or energies. It has been found that nanoparticles in the range of 3-120 nanometers works well in a wide range of operating conditions.

In the present embodiment the silicon or germanium particles are suspended in water. In other embodiments, as mentioned below, the particles are suspended in non-aqueous solutions. Preferably, a non-ionic surfactant such as polyethylene glycol (MW 200) is used which acts as a dispersant. It has been observed that the polyethylene glycol enables a stable suspension of nanoparticles which allows inkjet printing without kogation (build up of matter on the resistors of an inkjet printhead). Furthermore, it substantially prevents the sedimentation of particles at room temperature. Again the polyethylene glycol is used at 30% by volume. It is thought that the polyethylene glycol forms a coiled micelle structure in the aqueous solution with the non-polar portions of the molecule orientated away from the solution interface; the silicon or germanium nanoparticles being trapped in the centre of these micelles. In another embodiment, the surface of the silicon or germanium nanoparticles are capped with an organic capping ligand such as octanol or a carboxylate terminated alkyl group which facilitates their dispersion in non-aqueous or aqueous solvents and prevents oxidation of the surface through exposure to air.

Other additives may include liquid dopants. In the case of n-type dopants, as is used in this process step, an arsenic or phosphorus compound may be used. In the case of p-type dopants, boron compounds may be used. Humectants for improved inkjet performance (these prevent the evaporation of water by evaporation and the consequential blockage of the inkjet nozzles) and organic binders (mentioned above) may also be used to reduce the migration of particles during drying on a non-adsorbent surface. Suitable humectants for use in the present embodiment include 2-pyrollidinone and 1-3 propanediol. Suitable binders for use in the present embodiment include polyvinyl alcohol, and hydroxypropylcellulose. The skilled reader will understand that other materials with similar chemical properties may also be used in conjunction with other embodiments of the invention.

The process of inkjet printing the suspension of nanoparticles of an inorganic semiconductor material 110a and 110b is implemented by the third inkjet station 112 shown in FIG. 14b. This is illustrated for one of the transistors in FIG. 16i(1). The inorganic semiconductor suspension de-wets leaving the hydrophobic region 108 free of n-doped inorganic semiconductor. In other words, the hydrophobic region 108 repels the hydrophilic inorganic semiconductor suspension to create a clearly defined gate region of 4 microns in width; again referenced "A" in the FIG. 16i(2). It will be noted from the figure, that in the present example, the inorganic semiconductor suspension completely covers the small portions of the gate oxide $92b_1$ and $92b_2$ that were not covered by the hydrophobic regions 108. It will also be noted that the n-doped inorganic semiconductor areas 110a and 110b extend sufficiently to overlap with and to form a satisfactory electrical contact with the portions of copper respectively forming the drain and the source connectors for the transistor. In the case of one of the transistors, these are track portions 82g and 82b, respectively. This is more clearly illustrated in FIG. 16j.

A laser treatment process is then used to convert the n-type inorganic semiconductor 110a and 10b powder deposit into a continuous crystalline film. This is carried out by the laser of the third laser station 114 shown in FIG. 14b.

The laser treatment consists of a number of stages:
a) Drying: during drying, the solvent and low molecular weight organic additives are removed from the deposited nanoparticle powder (this may include water, or other carrier fluid);
b) Organic additive removal: including dispersants, capping ligands, binders and humectants where present;
c) Melting: the nanoparticle powder is caused to partially or totally melt to form a continuous film; and,
d) Recrystallisation: the continuous film is caused to increase it's atomic ordering by the formation and growth of crystals. This causes a reduction in the number of grain boundaries which facilitates improved electron flow.

In the present embodiment, each of the steps a-d is carried out in the presence of a reducing gas such as 2% Hydrogen in Argon. This has the effect of at least partially reversing any oxidisation of the particles that may have occurred. Preferably oxygen is excluded from the process during the steps a-d. This may be achieved using conventional techniques.

In the present embodiment, the heating steps a-d are all implemented using laser processing techniques, although in other embodiments other heating processes, such as the use of an oven may be used. It will be understood that the amount of laser energy required to carry out steps a-d will very depending upon individual process parameters and may be determined experimentally. Furthermore, it will be appreciated that various of the stages a-d may be combined, for example steps a and b, or a, b and c.

In the present embodiment, the following laser process parameters have been found to cause suitable recrystallisation of the continuous film of silicon or germanium. The wavelength may be in the range of 248 and 355 nm, the pulse widths may be in the range of 20 nS to 100 nS, with a repetition rate of 10 KHz-100 kHz and number of pulses 5-250; the energy densities may be in the range of 100 $mJ/cm^2$.-500 $mJ/cm^2$; the laser beamwidth may be any one of a range of values from 50 microns to several mm. It will be understood that, again, such parameters may vary in dependence upon a given set up. Thus, other values falling outside these values may also be used in given situations.

It has been found that the recrystallisation process works well by passing the laser beam across the semiconductor film in a raster fashion in a first direction whilst progressing the sample relative to the beam in perpendicular direction; thus causing the raster swaths overlap. In this manner, satisfactory recrystallisation may be caused throughout the sample. It is often preferable to select the wavelength of the laser so as not to be absorbed by the substrate. The depth of penetration of energy may be selected by appropriate choice of laser pulse width.

It has been found that by employing a substantially two stage laser process, firstly to fuse the particles and then to recrystallise the resultant film or layer, advantages are realised. During the fusing step, the particles can be rapidly brought into intimate contact with one another and then held together by surface tension of the liquid so formed. In this manner the possibility of causing ablation or physically disrupting the particles/film during the recrystallisation process may be mitigated. Furthermore, the prior fusing step allows improved heat transfer between the adjacent portions of the particles/film. This allows selected areas of the film to reorder relatively readily, producing recrystallisation of the now continuous film or layer as a comparatively more ordered crystalline structure progresses through the material during the recrystallisation phase.

It will be appreciated by the skilled reader that in other embodiments, the use of lasers may be replace, wholly or in part by the use of an oven or another heating device. However, the use of lasers has several advantages in the present embodiment. The first of these is that the heating power and of the laser and the affected or heated area may be precisely controlled. In this manner, other areas (for example the substrate) need not be affected or indeed damaged by the heating process. Secondly, laser heating lends itself conveniently to use in a production line environment. Ovens tend to be more suited to batch processes.

The area 115, illustrated for one of the transistors in FIG. 16k, indicates approximately the area influenced by the laser. The effect of the heating also causes the evaporation of the hydrophobic layer 108 and exposing the gate oxide region that was covered by the hydrophobic ink. The resulting structure, consists of n-doped inorganic semiconductor portions 110a and 110b, overlying the gate oxide 92, but separated from each other by a clearly defined gate region. This is illustrated for one of the transistors in FIG. 16k.

A suspension of nanoparticles of an inorganic semiconductor (such as silicon or germanium) containing p-type liquid dopants (such as boron compounds) 124, or suitable alternative, are then inkjet printed onto the source, drain and gate area region of each transistor, as shown in FIG. 16l. This is implemented by the fourth inkjet station 118 shown in FIG. 14b. The method for producing a suspension of the particles may be similar to that described for the n-type material. As can be seen from the figure, in the present embodiment, the p-type inorganic semiconductor completely covers the gate oxide portion 92 and substantially covers the n-type inorganic semiconductor portions 110a and 110b.

The p-type inorganic semiconductor deposit 124 is then treated by the fourth laser station 122, shown in FIG. 14b, in a similar manner to that described above, to cause it to melt and recrystallise. The recrystallized p-type inorganic semiconductor 126 is illustrated in FIG. 16m.

FIG. 16n, shows a cross a side elevation sectional view of a transistor according to the present embodiment. From the figure, the n-p-n structure of the transistor, including the drain 132, gate 134, source 136 and p-front contact 138 of the transistor may be seen.

Manufacture of Resistor

Referring to FIGS. 17a-h together with FIG. 14c, a method of constructing resistors according to the present embodiment of the invention will now be described.

Figure 17A:
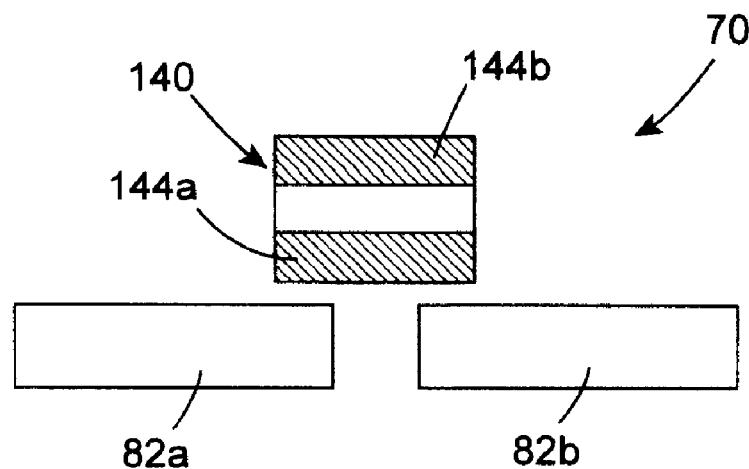

FIG. 17a illustrates a flexible substrate 70 upon which a resistor is to be constructed. As can be seen from the figure, the substrate has been pre-patterned with copper tracks 82a and 82b, similar to those described above, in predetermined positions. As can be seen in the figure a space separates the copper tracks 82a and 82b, in which a resistor according to the present embodiment is to be constructed.

The next step in the process of manufacturing a resistor according to the present embodiment is a soft contact lithographic printing operation, of the type described above, which is carried out with a stamp 140 at by the lithographic printing station 142 in FIG. 14c. As can be seen from the schematic FIG. 17a, the stamp 140 has two PDMS printing features 144a and 144b used to print hydrophobic ink. The features are straight lines or stripes. The length of each of the stripes is significantly longer than the space separating the copper tracks 82a and 82b. The stripes are arranged parallel to each other and spaced apart from each other by an accurately controlled distance. In this example, the distance separating the printing features 144a and 144b is somewhat less than the width of the copper tracks 82a and 82b.

Figure 17B:
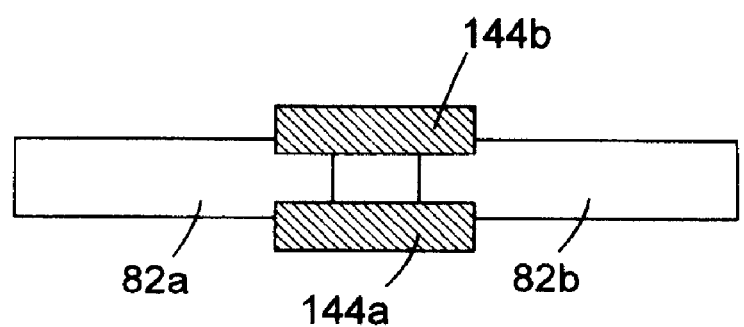
Figure 17C:
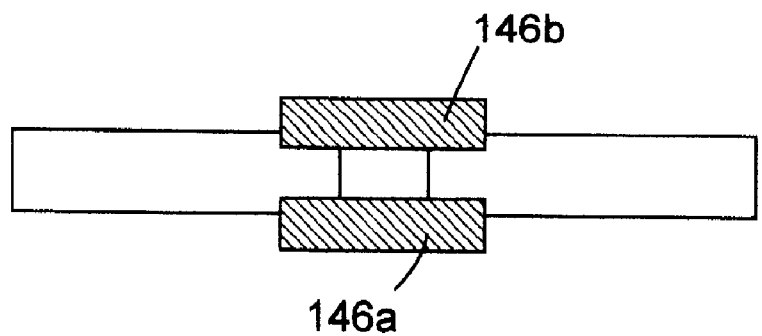

The stamp 140 is loaded with hydrophobic material, as described above, and aligned with the copper tracks 82a and 82b. This is as illustrated in FIG. 17b. In this example, each of the features is aligned such that it slightly overlaps each of the copper tracks 82a and 82b. The stamp is then brought into contact with the substrate and removed, thus leaving residual hydrophobic regions 146a and 146b. This is illustrated in FIG. 17c. In this manner, an enclosed rectangular area of substrate is created, bounded by the two copper tracks 82a and 82b and the two hydrophobic regions 146a and 146b.

Figure 17D:
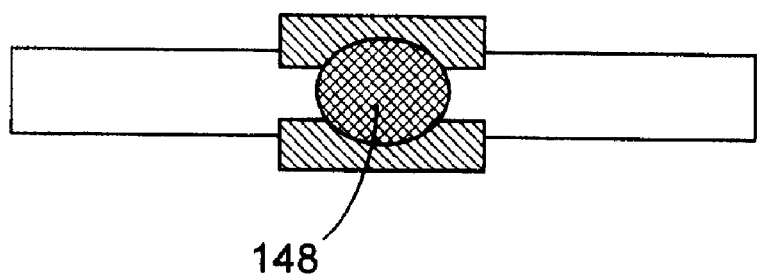

A hydrophilic resistor material 148 is then printed throughout the enclosed rectangular area by an inkjet printing station 150 in FIG. 14c. This is illustrated in FIG. 17d. By printing the resistor material 148 up to and over a portion of the hydrophobic regions 146a and 146b and the copper tracks 82a and 82b it may be ensured that resistor material 148 is printed throughout the enclosed rectangular area. It will be appreciated that sufficient resistor material 148 is printed into this region and over part of each end of the copper tracks 82a and 82b so as to electrically connect the two the copper tracks. Preferably, this is carried out in a uniform manner throughout the area in which the resistor material is deposited. In the present embodiment, the resistor material is ruthenium dioxide particles in a water solution, although any suitable material may instead be used.

Figure 17E:
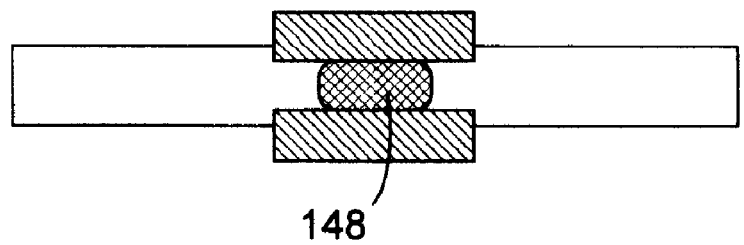

As can be seen from FIG. 17e, the width of the resistor is "trimmed" by the fact that the hydrophobic regions 146a and 146b repel the hydrophilic resistor material. This creates a clearly defined area of resistor material 148a lying between the copper tracks 82a and 82b, with a precisely fixed width; i.e. the distance separating the two hydrophobic regions 146a and 146b.

As is stated above, the hydrophobic regions 146a and 146b span both the space between the copper tracks 82a and 82b and the end portion of each of the tracks themselves. Thus, it may be easily be ensured that the trimmed area of resistor 148a material covers a portion of each of the tracks, providing an electrical connection between them, whilst ensuring that the width of the resistor material is precisely regulated.

Figure 17F:
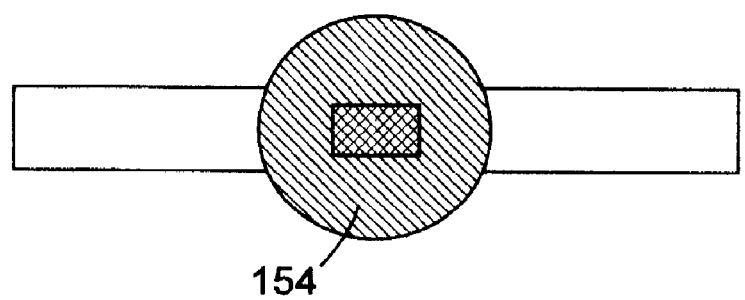
Figure 17G:
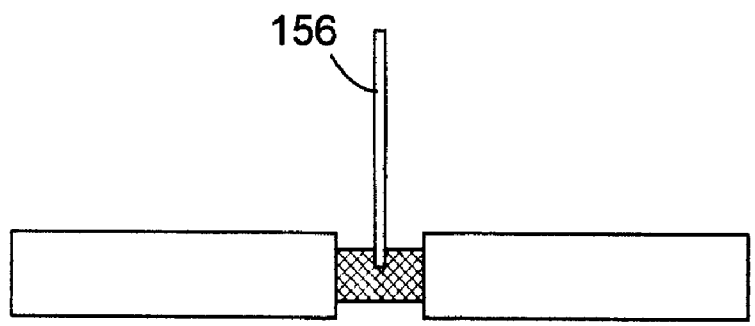

The resistor material is then baked by a pulsed laser, which is implemented by the laser station 152 in FIG. 14c in a conventional manner. This process is illustrated in FIG. 17f, where the area 154 indicates the approximate area of influence of the laser.

Figure 17H:
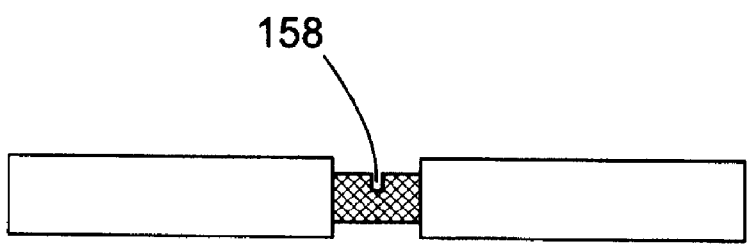

The width of the resistor material 148a may then, if required, be trimmed further to modify the electrical resistance of the resistor. Since the resistor was printed onto the substrate uniformly, a linear relationship should exist between its width and its resistance. Any further trimming may be carried out using conventional pulsed laser ablation techniques, in conjunction with the motion-image analysis system 48. This is illustrated schematically in FIG. 17g, in which the laser beam is referenced 156. The resulting "trimmed" resistor is illustrated in FIG. 17h, in which the ablated portion of the resistor is referenced 158.

In the present embodiment, this laser ablation is carried out, where required, by the laser station 152 in FIG. 14c. If desired, however, a further laser station could be incorporated into the line process to undertake this process.

Manufacture of Capacitor

Referring to FIGS. 18a to 18k together with FIG. 14d, a method of constructing capacitors according to the present embodiment of the invention will now be described.

Figure 18A:
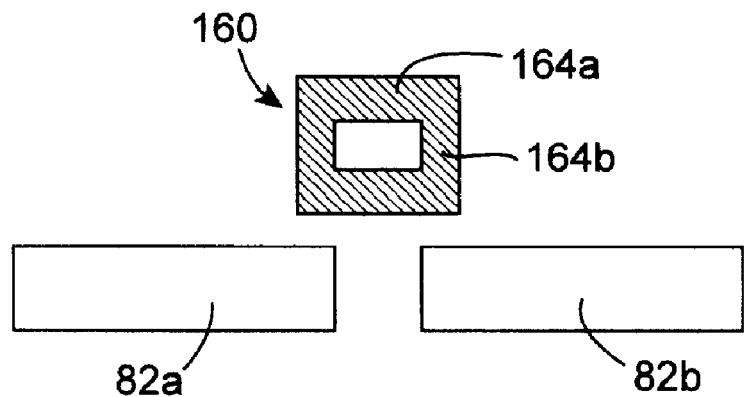

FIG. 18a illustrates a flexible substrate 70 upon which a capacitor is to be constructed. As can be seen from the figure, the substrate 70 has been pre-patterned with copper tracks 82a and 82b, similar to those described above. As can be seen in the figure a space separates the copper tracks 82a and 82b.

Figure 18B:
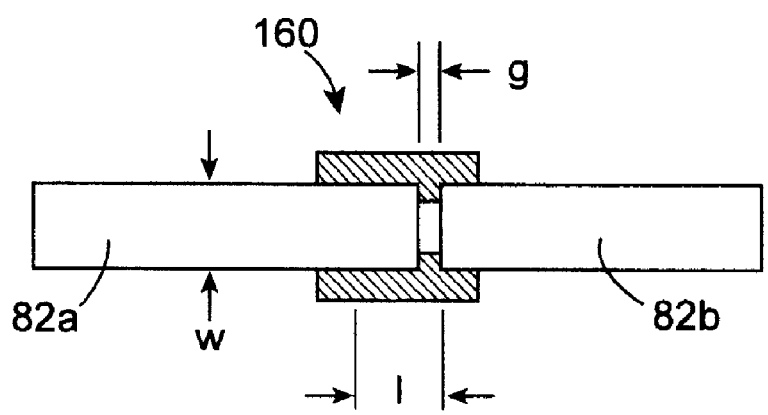
Figure 18C:
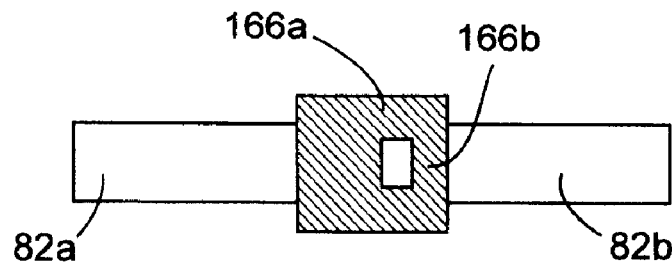

The next step in the process of manufacturing a capacitor according to the present embodiment is a lithographic printing operation, of the type described above, which is carried out with a stamp 160 at the first lithographic printing station 162 in FIG. 14d. As can be seen from the FIG. 18a, the stamp 160 has PDMS a printing feature with horizontal 164a and vertical 164b elements or stripes of predetermined width. The horizontal 164a and vertical 164b elements enclose a rectangular non-printing space of accurately defined width and length. This is illustrated in FIG. 18b. As can be seen from the figure, the width of the rectangular non-printing space is referenced "w" and the length of the rectangular non-printing space is referenced "l" plus "g".

The stamp 160 is loaded with hydrophobic material and aligned with the copper tracks 82a and 82b as is indicated in FIG. 18b. The stamp is then brought into contact with the substrate and removed, as described above, leaving residual a hydrophobic region bounding a non-printed rectangular space of dimensions "l" plus "g" by 'w", as can be seen from FIGS. 18b and 18c.

In the present embodiment, stamp is aligned such that the length of the rectangular non-printing space lies substantially parallel to the length of the copper track 82a and such that a length "l" of the copper track 82a lies with non-printed rectangular space. Furthermore, as can be seen from FIG. 18b, the width of the rectangular non-printing space is somewhat less than the width of the track 82a and the stamp is aligned such that width of the non-printed rectangular space is arranged centrally with respect to the width of the track 82a. In this manner, there is exposed an area of the copper track 82a of width marked "w" and length "l" in the non-printed rectangular space. As can also be seen from the figures, an area of substrate material of width "w" and length "g" is also exposed in the non-printed rectangular space. This exposed area of substrate lies in the space between the tracks 82a and 82b, adjacent the end of the track 82a. Part of the hydrophobic region separates the exposed area of substrate material from the track 82b. As will be seen from the following description, this arrangement helps to avoid the risk of short circuit between different areas of the capacitor.

Figure 18D:
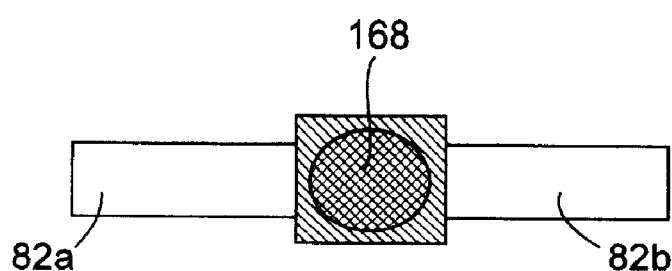

An aqueous suspension of silicon dioxide nanoparticles is then inkjet printed throughout in the non-printed rectangular space, bounded by hydrophobic region 168. The method of preparing the silicon dioxide suspension may be that same as that described above with regard to the manufacture of a transistor according to the present embodiment of the invention. This is illustrated in FIG. 18d and is implemented by the first inkjet printing station 170 in FIG. 14d. By printing the dielectric ink 168 up to and partially over the hydrophobic printed regions, as is illustrated in the figure, it can be ensured that this whole area may be covered with the dielectric ink. Preferably, the dielectric ink is printed in a uniform manner.

Figure 18E:
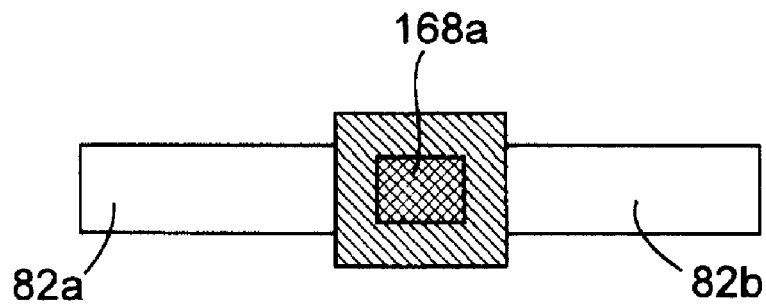

As is described above with regard to the manufacture of a resistor, the dielectric ink 168 is "trimmed" by the action of the hydrophobic printed regions, which repel the hydrophilic dielectric ink 168. The trimmed area of dielectric ink 168a is illustrated in FIG. 18e. As can be seen from this figure, this creates an area of dielectric with a clearly defined dimensions corresponding to the non-printing rectangular space in the stamp. The dielectric ink may then be laser treated to cause organic removal and melting. For example, by using directed laser heating or an infrared source, not shown in FIG. 14d. At the same time, the hydrophobic ink may be removed by evaporation. The area of influence of the laser, for example, is referenced 170 in FIG. 18f. The resultant structure is illustrated in FIG. 18g.

A second hydrophobic region 174 is then printed in a further lithographic printing operation. The second lithographic printing station 172 in FIG. 14d carries this out. The hydrophobic region 174 is printed, using a stamp (not shown), which is similar to the stamp 160, in that its printing element has a printing area, which enclose a non-printing rectangular space.

Figure 18F:
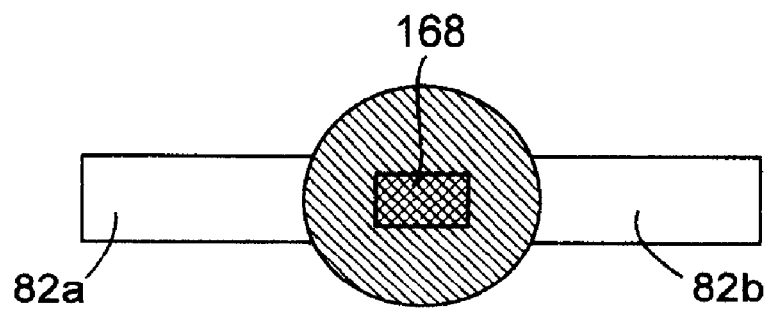
Figure 18G:
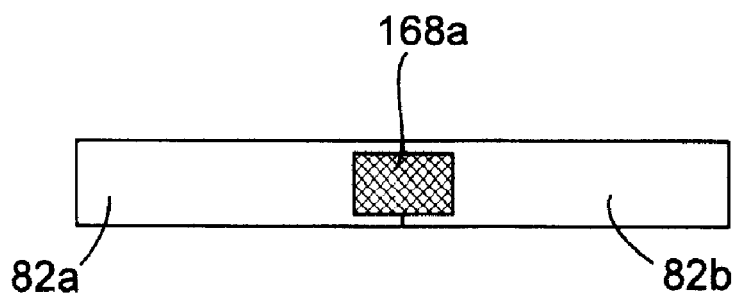
Figure 18H:
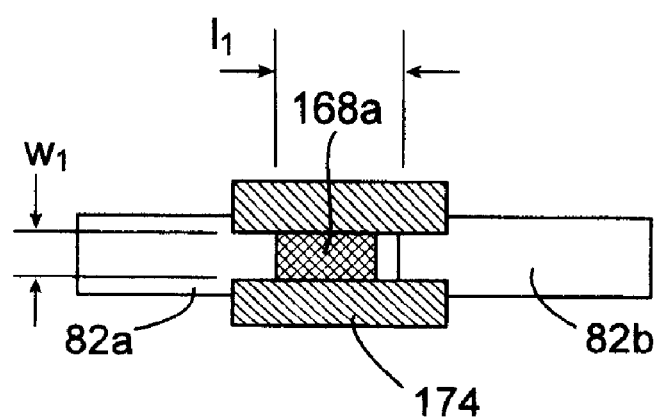

The hydrophobic region 174 printed by the second lithographic printing station 172 is illustrated in FIG. 18f. As can be seen from the figure, the non-printing rectangular space enclosed by the hydrophobic region 174 has a width "$w_1$", which is less than the with "w" of the non-printing rectangular space of the mask 160 and a length "$l_1$" that is significantly longer than that of the non-printing rectangular space of the mask 169. The hydrophobic region 174 is positioned such that the rectangular space which it encloses spans both a portion of the copper track 82b and a portion of the dielectric area 168a, with the length of the rectangular space being approximately parallel to the length of the dielectric area 168a. Furthermore, the hydrophobic region 174 is positioned such that none of copper track 82a is exposed inside the rectangular space, which it encloses.

Figure 18I:
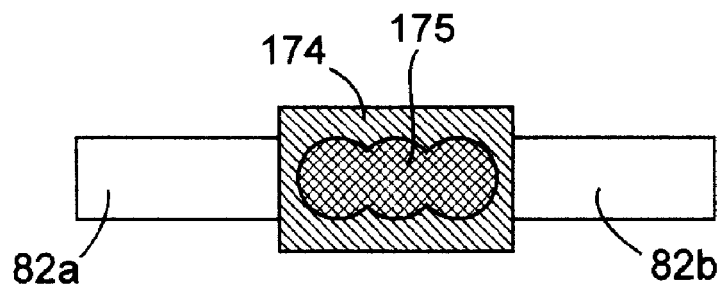
Figure 18J:
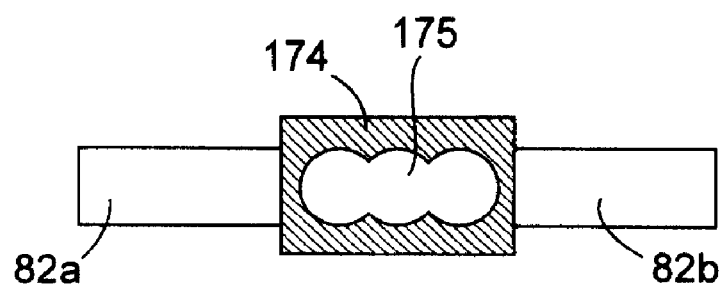

A conductor ink 175, such as gold nanoparticles suspended in water is then inkjet printed throughout the rectangular space enclosed by the hydrophobic region 174. This is illustrated in FIG. 18i and is carried out by the second inkjet printing station 178 shown in FIG. 14d. Since in the present embodiment, the conductor is printed in a hydrophilic solution, it is repelled by the hydrophobic area 174. The method of preparation of the suspension of gold nanoparticles may be as described above with reference to the construction of the transistor according to the present embodiment of the invention. Thus, the electrical conductor 175 trims to the area of the rectangular space enclosed by the hydrophobic region 174 as is illustrated in FIG. 18j. In this manner, an electrical connection is formed between the copper track 82b and the dielectric area 168a, whilst no direct electrical connection is formed between the conductor 175 and the copper track 82a. The deposit of gold nanoparticles is then treated with a laser in the manner described previously to cause the removal of organic material and melting.

Figure 18K:
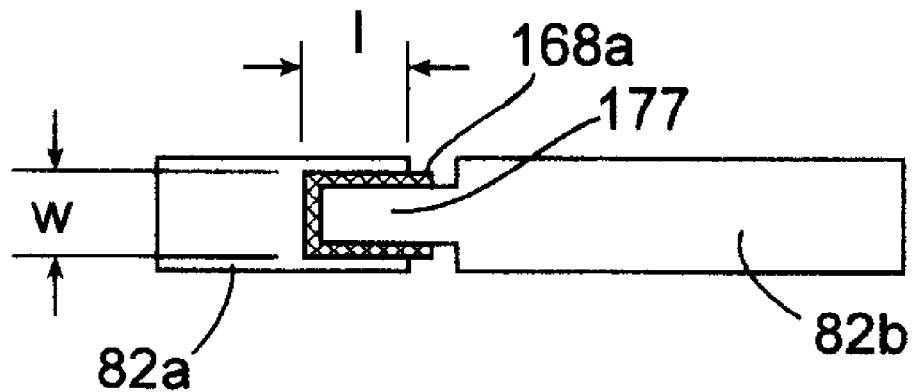
Figure 18K:
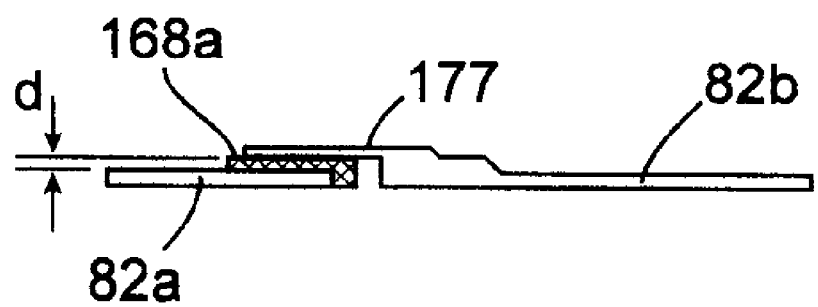

Referring to FIG. 18k, this sequence of operations results in a capacitor comprising a bottom electrode of area A, equivalent to "l" multiplied by "w", a dielectric layer 168a of thickness and "d", and dielectric constant ∈, and a top electrode 177. It will be recognized that the characteristics of the capacitor are determined by the formula C=∈.A/d. Thus, using the process of the present embodiment, capacitors of require characteristics may be manufactures by varying the area A, or thickness "d", or dielectric constants ∈.

Further Embodiments

It will be apparent, however, to one skilled in the art that in the above embodiment numerous specific details are set forth in order to provide a thorough understanding of the present invention. It will though be apparent that the present invention may be practiced without limitation to these specific details. Furthermore, in other cases, well known methods and structures have not been described in detail so as not to unnecessarily obscure the present invention.

In the embodiments described above, the construction of the various electronic components uses, at least in part inkjet printing techniques. In the described embodiment, this was implemented using scanning type inkjet printheads. In practice, this could be achieved using static page wide arrays of inkjet printheads. Alternatively, other printing techniques, such as offset lithographic (photogravure) or digital offset printing methods, may instead be used.

Although in the above description, the stamping process is described as being implemented with a stamping surface which is raised and lowered relative to the substrate in order to implement the stamping process, it will be appreciated that in other embodiments of the invention, this need not be the case. For example, in higher throughput systems, the stamp or stamps may each be in the form of a drum. Raised features on the surface of the drum may be arranged to be loaded with hydrophobic ink, while the drum rotates. A substrate maybe driven past the drum such that such that the raised features are periodically brought into contact with the substrate, thus transferring the hydrophobic ink to the substrate in desired areas.

Although a suspension of gold nanoparticles is used in this example, other suitable suspensions containing particles of copper (Cu) or aluminum (Al) may also be used.

Although a method of manufacturing MOSFET transistors is described above, in a further embodiment, BIPOLAR transistors may instead be manufactured. The skilled read will appreciate that other embodiments of the invention may be used to manufacture further structures, or other types of electronic components. For example, soft contact lithography may be used in one embodiment to provide high accuracy hydrophobic lines of demarcation separating, inkjet printed copper interconnects. In this manner, shorts circuits may be avoided. This may be particularly useful, when the interconnects are tightly packed. Furthermore, RF Antennas for radio frequency ID tags Antennas may be printed with enhanced resolution using to allow more precise operation. In a further embodiment of the invention, magnetic material may be accurately printed, using inkjet techniques for example, using hydrophobic stamped areas to accurately control the position of the magnetic material. Such a techniques may be used to manufacture magnetic codes in printed labels. Such magnetic labels may be printed in a series of stripes and spaces, similar to bar codes. In one such embodiment, the code may be read both optically and magnetically for increased security. In a further embodiment, high precision hydrophobic stamped areas may be used to allow magnetic tracks on disks to be more densely packed to allow the recording density of the disk to be increased.

Although the generation of crystalline films of silicon or germanium have been described, it will be understood that it is also possible to generate compound films of silicon and germanium (SiGe) in other embodiments of the invention. In this manner, low cost, high frequency devices such as hetrojunction bipolar transistors may be readily fabricated without using the costly, process of chemical vapour deposition currently used. Furthermore, producing such compound films according to embodiments of the invention, other disadvantages of chemical vapour deposition may be avoided. These include, for example, restricted sizes and relatively high number of process steps etc.

In one embodiment according to the invention, such compound films, for example, mixtures of silicon and germanium nanoparticles (i.e. some silicon nanoparticles and some germanium nanoparticles), may be printed to form a single layer of mixed nanoparticles. This may be achieved using an inkjet process as described above. Subsequently, this layer of mixed silicon and germanium nanoparticles may be fused and recrystallised. Again, this may be carried out as described above, using one or more laser heating processes.

In a further embodiment according to the invention, such compound films, may be generated by printing a single layer of nanoparticles. The nanoparticles in this case contain atoms of two distinct materials (i.e. nanoparticles containing two or more materials or chemical elements), for example, silicon and germanium. This printing step may again be achieved using an inkjet process as described above. This layer of nanoparticles may be fused and recrystallised, again using one or more laser heating processes for example, to produce a silicon and germanium recrystallised (SiGe) film.

In a further embodiment according to the invention, nanoparticles of germanium may be deposited on a substrate and recrystallised to form a recrystallised germanium film. Nanoparticles of silicon may then be deposited on the recrystallised germanium film. The subsequent recrystallisation of the silicon forms a compound film of a recrystallised silicon film overlying a recrystallised germanium film. Such a structure is known as a strained silicon on germanium film. It will also be appreciated that such a structure may be produced the other way around, or in the reverse order, giving rise to a germanium on silicon film.

The skilled reader will appreciate that the various further embodiments described herein may be used in combination with one or more of the remaining further embodiments.

The invention claimed is:

1. A method of manufacturing an electronic component comprising at least one of an n-doped portion or a p-doped portion, the method comprising:
    depositing a hydrophobic material on a substrate to define a region;
    depositing a liquid on the substrate, wherein a hydrophobic/hydrophilic interaction between the deposited hydrophobic material and the deposited liquid conforms the liquid to the defined region, wherein the liquid comprises a dopant and suspended nanoparticles, the nanoparticles comprising at least one of silicon or germanium;
    fusing in situ on the substrate the nanoparticles by heating to form a continuous layer through a physical change of melting; and
    recrystallizing the continuous layer to form the at least one of the n-doped portion or the p-doped portion.

2. The method of claim 1, wherein the nanoparticles have an average diameter in the range of 3-120 nanometers.

3. The method of claim 1, wherein at least one of the fusing or the recrystallizing is performed in a reducing atmosphere.

4. The method of claim 3, wherein the reducing atmosphere comprises approximately 2% hydrogen.

5. The method of claim 3, wherein the reducing atmosphere comprises an inert gas.

6. The method of claim 1, wherein the fusing is performed using one or more first laser pulses.

7. The method of claim 6, wherein the recrystallizing is performed using one or more second laser pulses subsequent to the first laser pulses.

8. The method of claim 1, wherein at least one of the fusing or the recrystallizing is performed in an oven.

9. The method of claim 8, wherein the recrystallizing comprises cooling the fused nanoparticles under conditions to cause recrystallization.

10. The method of claim 1, wherein the liquid comprises a dispersion agent to stabilize the suspension of the nanoparticles in the liquid.

11. The method of claim 10, wherein the dispersion agent comprises a non-ionic surfactant.

12. The method of claim 11, wherein the non-ionic surfactant comprises polyethylene glycol.

13. The method of claim 1, wherein the liquid is deposited using at least one of an inkjet printing process, a digital offset printing process, or a digital printing process.

14. The method of claim 1, further comprising depositing the hydrophobic material using a printing process.

15. The method of claim 14, wherein the printing process comprises a lithographic printing process.

16. The method of claim 1, wherein the hydrophobic material comprises a paraffin wax dissolved in toluene.

17. The method of claim 1, wherein the recrystallized continuous layer forms at least one of a source, a drain, a gate region of a transistor, a component of a p-n junction, a component of an n-p junction, a component of a p-n-p junction, or a component of an n-p-n junction.

18. The method of claim 1, wherein the electronic component comprises at least one of a transistor, a capacitor, or a diode.

19. An electronic component, or a component thereof manufactured using the method of claim 1.

20. A hetrojunction bipolar transistor according to claim 19.

* * * * *